(12) United States Patent
Kim et al.

(10) Patent No.: US 12,243,759 B2
(45) Date of Patent: Mar. 4, 2025

(54) SUBSTRATE FOR MANUFACTURING DISPLAY DEVICE AND METHOD FOR MANUFACTURING DISPLAY DEVICE

(71) Applicant: LG ELECTRONICS INC., Seoul (KR)

(72) Inventors: Kisu Kim, Seoul (KR); Changseo Park, Seoul (KR); Philwon Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 502 days.

(21) Appl. No.: 17/620,432

(22) PCT Filed: Jun. 24, 2019

(86) PCT No.: PCT/KR2019/007590
§ 371 (c)(1),
(2) Date: Dec. 17, 2021

(87) PCT Pub. No.: WO2020/256203
PCT Pub. Date: Dec. 24, 2020

(65) Prior Publication Data
US 2022/0351992 A1    Nov. 3, 2022

(30) Foreign Application Priority Data

Jun. 18, 2019  (KR) ........................ 10-2019-0072398

(51) Int. Cl.
*H01L 21/67* (2006.01)
*H01L 21/683* (2006.01)
(Continued)

(52) U.S. Cl.
CPC .... *H01L 21/67144* (2013.01); *H01L 21/6835* (2013.01); *H01L 25/0753* (2013.01);
(Continued)

(58) Field of Classification Search
CPC ............. H01L 33/62; H01L 2933/0066; H01L 25/0753; H01L 2221/68368; H01L 21/6835
See application file for complete search history.

(56) References Cited

U.S. PATENT DOCUMENTS 9,875,974 B2 *  1/2018  Rogers ................ H01L 21/8238
2002/0005294 A1    1/2002  Mayer et al.
(Continued)

FOREIGN PATENT DOCUMENTS

KR    10-2012-0138805 A    12/2012
KR    10-2013-0033450 A    4/2013
(Continued)

OTHER PUBLICATIONS

Smith et al., "Field Configured Assembly: Programmed Manipulation and Self-assembly at the Mesoscale", Appl. Phys. Lett., vol. 77, No. 9, Aug. 28, 2000 (Year: 2000).*
(Continued)

*Primary Examiner* — Walter H Swanson
*Assistant Examiner* — Moataz Khalifa
(74) *Attorney, Agent, or Firm* — Birch, Stewart, Kolasch & Birch, LLP

(57) ABSTRACT

Discussed in an assembly substrate used in a display manufacturing method for placing semiconductor light-emitting devices to predetermined positions thereof using an electric field and a magnetic field, the assembly substrate including: a base part; a plurality of pair electrodes extending in one direction and disposed in parallel on the base part; a dielectric layer disposed on the base part to cover the plurality of pair electrodes; and partition walls disposed on the dielectric layer and defining cells at predetermined intervals along the one direction of the plurality of pair electrodes so as to overlap portions of the plurality of pair electrodes, and the
(Continued)

semiconductor light-emitting devices being placed into the cells, respectively, wherein at least one of a recess portion and a concave and convex portion is formed on an upper surface of each of the partition walls.

20 Claims, 19 Drawing Sheets

(51) Int. Cl.
| | |
|---|---|
| *H01L 23/00* | (2006.01) |
| *H01L 25/075* | (2006.01) |
| *H01L 33/32* | (2010.01) |
| *H01L 33/40* | (2010.01) |

(52) U.S. Cl.
CPC .............. *H01L 24/83* (2013.01); *H01L 24/95* (2013.01); *H01L 33/325* (2013.01); *H01L 33/40* (2013.01); *H01L 2221/68368* (2013.01); *H01L 2224/83005* (2013.01); *H01L 2224/95001* (2013.01)

(56) References Cited

U.S. PATENT DOCUMENTS

| | | |
|---|---|---|
| 2005/0009303 A1 | 1/2005 | Schatz |
| 2010/0101700 A1* | 4/2010 | Liang ...................... B32B 27/40 156/73.6 |
| 2018/0019369 A1* | 1/2018 | Cho ....................... H01L 27/156 |
| 2018/0312421 A1 | 11/2018 | Garner et al. |
| 2019/0058080 A1 | 2/2019 | Ahmed et al. |

FOREIGN PATENT DOCUMENTS

| | | |
|---|---|---|
| KR | 10-2018-0007376 A | 1/2018 |
| KR | 10-2018-0081378 A | 7/2018 |
| KR | 10-2019-0029251 A | 3/2019 |

OTHER PUBLICATIONS

Smith et al., "Electric-field assisted assembly and alignment of metallic nanowires", Appl. Phys. Lett., vol. 77, No. 9, Aug. 28, 2000, pp. 1399-1401 (Year: 2000).*

* cited by examiner 155 154 153 159

155 154 153

159

156    155 154 153

159

(a) L ≥ R (b) L < R

SUBSTRATE FOR MANUFACTURING DISPLAY DEVICE AND METHOD FOR MANUFACTURING DISPLAY DEVICE

CROSS REFERENCE TO RELATED APPLICATIONS

This application is the National Stage filing under 35 U.S.C. 371 of International Application No. PCT/KR2019/007590, filed on Jun. 24, 2019, which claims the benefit of earlier filing date and right of priority to Korean Application No. 10-2019-0072398, filed on Jun. 18, 2019, the contents of all these applications are hereby incorporated by reference herein in their entirety.

TECHNICAL FIELD

The present disclosure relates to an assembly substrate used in a method for manufacturing a display device and a method for manufacturing a display device using a semiconductor light-emitting device with a size of several to tens of µm.

BACKGROUND ART

The current competing technologies for large area display are liquid crystal displays (LCDs), organic light-emitting diode (OLED) displays, micro-LED displays, and the like.

However, there exist problems such as not-so-fast response time and low efficiency of light generated by backlight in the case of the LCDs, and there exist drawbacks such as a short lifespan, not-so-good yield, and low efficiency in the case of the OLEDs.

The use of semiconductor light-emitting diodes (micro-LEDs (µLEDs)) with a diameter or cross-sectional area of 100 microns or less in a display may provide very high efficiency because the display does not use a polarizer to absorb light. However, since a large display requires millions of LEDs, it has difficulty in transferring the LEDs compared to other technologies.

Pick and place, laser lift-off (LLO), self-assembly, and the like have been developed for transfer techniques. Among them, the self-assembly technique, which is a method in which semiconductor light-emitting diodes are self-organized in a fluid, is the most suitable method for realizing a large screen display device.

The self-assembly may include a method of directly assembling semiconductor light-emitting devices to a final substrate (or wiring substrate) in which wiring is formed, and a method of assembling semiconductor light-emitting devices on an assembly substrate and then transferring the semiconductor light-emitting devices to a final substrate through an additional transfer process. Both the two methods are selectively used as they have their own advantages. For example, the former is efficient in the process perspective, and the latter is advantageous in that a structure for the self-assembly can be added without limitation.

DISCLOSURE OF INVENTION

Technical Problem

The present disclosure describes an assembly substrate having a structure that can improve a transfer rate in a process of transferring semiconductor light-emitting devices seated on an assembly substrate, which is a substrate for manufacturing a display device, to a transfer substrate, and a method for manufacturing a display device.

The present disclosure also describes an assembly substrate having a structure that can reduce a misassembly rate and improve an assembly rate of semiconductor light-emitting devices during self-assembly, and a method for manufacturing a display device.

Solution to Problem

According to one aspect of the subject matter described in this application, there is provided an assembly substrate used in a display manufacturing method for placing semiconductor light-emitting devices to predetermined positions of the assembly substrate using an electric field and a magnetic field. The assembly substrate includes: a base part; a plurality of pair electrodes extending in one direction and disposed in parallel on the base part; a dielectric layer disposed on the base part to cover the plurality of pair electrodes; and partition walls disposed on the dielectric layer and defining cells at predetermined intervals along the extension direction of the plurality of pair electrodes so as to overlap portions of the plurality of pair electrodes, the semiconductor light-emitting devices being placed into the cells, respectively. At least one of a recess portion and a concave and convex portion is formed on an upper surface of each of the partition walls.

Implementations according to this aspect may include one or more of the following features. For example, the plurality of pair electrodes may each include protruding portions protruding from surfaces facing each other and disposed at predetermined intervals along the extension direction of the pair electrode, and each of the cells may overlap the protruding portions.

In some implementations, the protruding portions protruding from electrodes of the pair electrode may face each other.

In some implementations, the protruding portions may each have a length shorter than a length of the cell based on the extension direction of the pair electrode.

In some implementations, the recess portion may be formed along at least a portion of a periphery of the cell to allow a side surface of the semiconductor light-emitting device placed into the cell to be exposed.

In some implementations, the concave and convex portion may be formed along at least a portion of a periphery of the cell.

In some implementations, the concave and convex portion may be formed on the recess portion when the partition wall includes both the recess portion and the concave and convex portion.

In some implementations, the recess portion may be formed along at least a portion of a periphery of the cell.

In some implementations, the assembly substrate may be made of two or more different materials having different surface energy with respect to a specific material.

In some implementations, a material having the highest surface energy with respect to the specific material may define at least a portion of an inner periphery of the cell.

In some implementations, a material having the lowest surface energy with respect to the specific material may define at least a portion of the upper surface of the partition wall.

In some implementations, the specific material may be polydimethylsiloxane (PDMS).

According to another aspect, there is provided a method for manufacturing a display device. The method includes:

moving the assembly substrate according to claim 1 to an assembly position and putting a plurality of semiconductor light-emitting devices including magnetic materials into a fluid chamber; applying a magnetic force to the semiconductor light-emitting devices put into the fluid chamber to cause the semiconductor light-emitting devices to move in one direction; applying an electric field to guide the semiconductor light-emitting devices to predetermined positions while moving such that the semiconductor light-emitting devices are placed at the predetermined positions of the assembly substrate; transferring the semiconductor light-emitting devices placed at the predetermined positions to a transfer substrate; and transferring the semiconductor light-emitting devices seated on the transfer substrate to a final substrate in which wiring is formed. At least one of a recess portion and a concave and convex portion formed on the upper surface of each of the partition walls reduces energy acting between the assembly substrate and the transfer substrate.

Implementations according to this aspect may include one or more of the following features. For example, a surface of the transfer substrate is made of polydimethylsiloxane (PDMS).

Advantageous Effects of Invention

In accordance with the detailed description, structural features or characteristics of an assembly substrate used for manufacturing a display device allows energy acting between the surface of the assembly substrate and the surface of a transfer substrate to be reduced, thereby improving the transfer rate of semiconductor light-emitting devices to the transfer substrate.

In detail, as at least one of a recess portion and a concave and convex portion is formed on an upper surface of a partition wall of the assembly substrate, a contact area between the assembly substrate and the transfer substrate can be reduced to thereby reduce energy acting between the surface of the assembly substrate and the surface of the transfer substrate. As a result, the transfer rate of semiconductor light-emitting devices can be increased. When the recess portion and/or the concave and convex is formed in a periphery of a cell into which the semiconductor light-emitting device is placed, the transfer rate of the semiconductor light-emitting devices can be particularly improved.

In addition, with the assembly substrate having the aforementioned structure, the assembly substrate may be formed of two or more materials having different surface energy from a specific material (e.g., a material forming the surface of the transfer substrate) so that regions of the assembly substrate can have different contact forces with respect to the transfer substrate, thereby increasing the transfer rate of the semiconductor light-emitting devices. As the periphery of the cell into which the semiconductor light-emitting material is placed is made of a material having the highest surface energy with respect to the specific material, the transfer rate of the semiconductor light-emitting devices can be improved in particular.

MODE FOR THE INVENTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present invention is not limited by the accompanying drawings. It will be understood that when an element such as a layer, area or substrate is referred to as being "on" another element, it can be directly on the element, or one or more intervening elements may also be present.

A display device disclosed herein may include a mobile phone, a smart phone, a laptop computer, a digital broadcast terminal, a personal digital assistant (PDA), a portable multimedia player (PMP), a navigator, a slate PC, a tablet PC, an ultrabook, a digital TV, a desktop computer, and the like. However, it would be readily apparent to those skilled in the art that the configuration according to the implementations described herein may also be applied to a new product type of display device that will be developed later.

Figure 1:
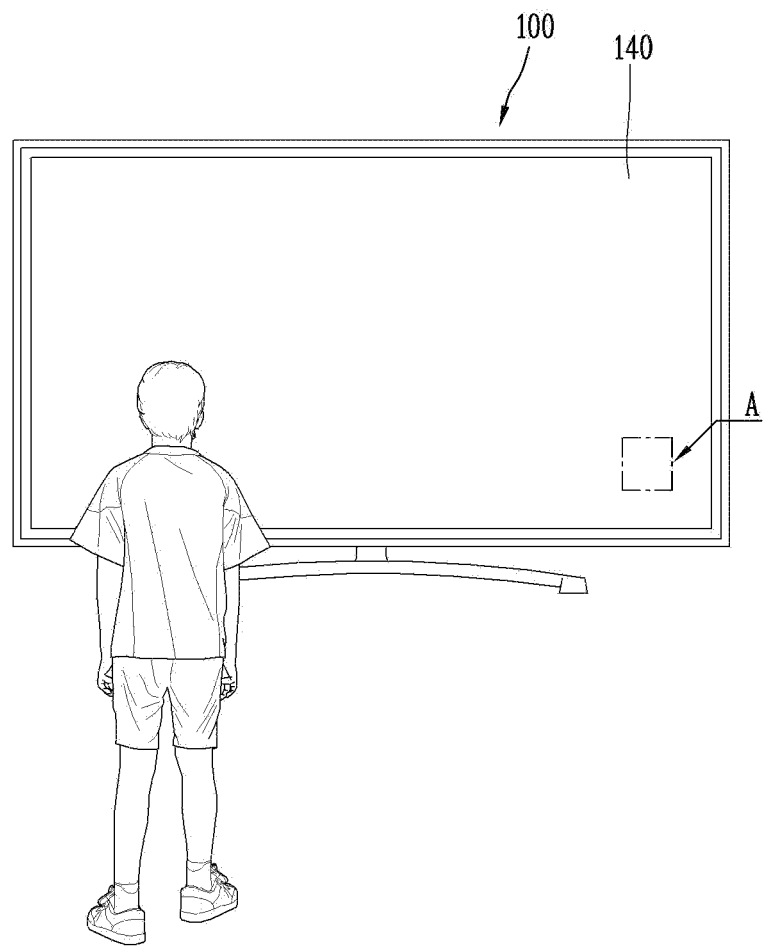
FIG. 1 is a conceptual view illustrating a display device using a semiconductor light-emitting device (diode) according to one implementation of the present disclosure.
Figure 2:
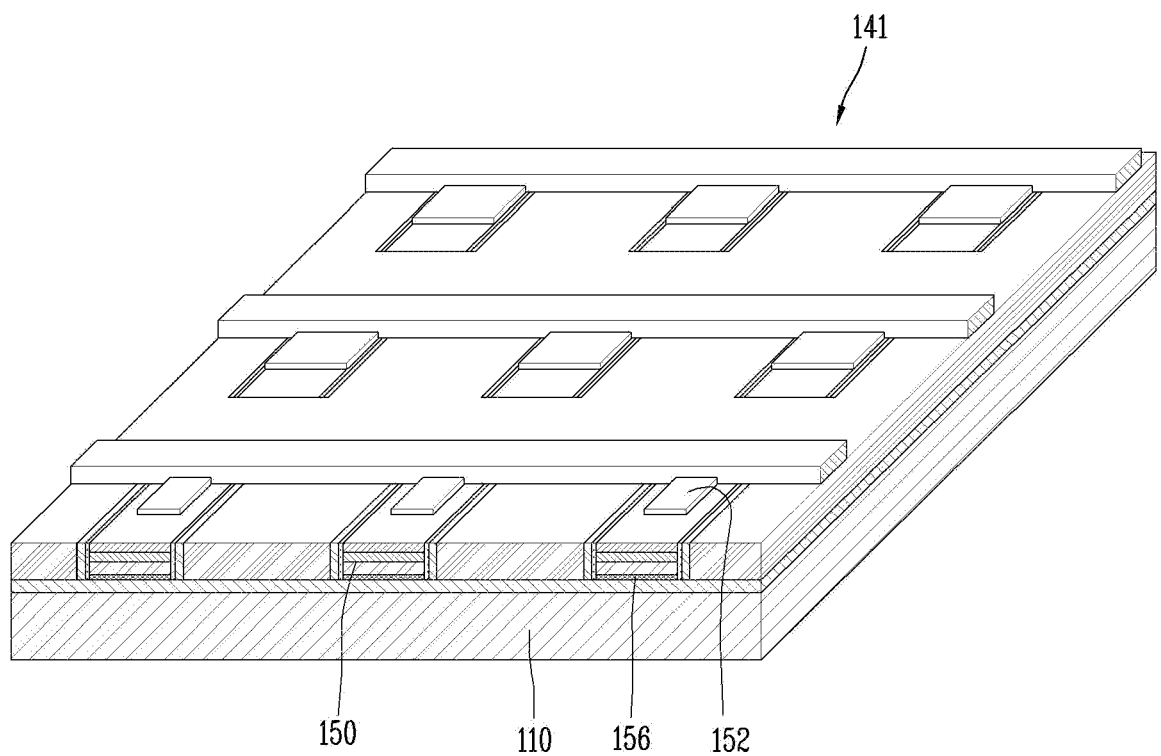
FIG. 2 is an enlarged view of a portion "A" of the display device in FIG. 1.
Figure 3:
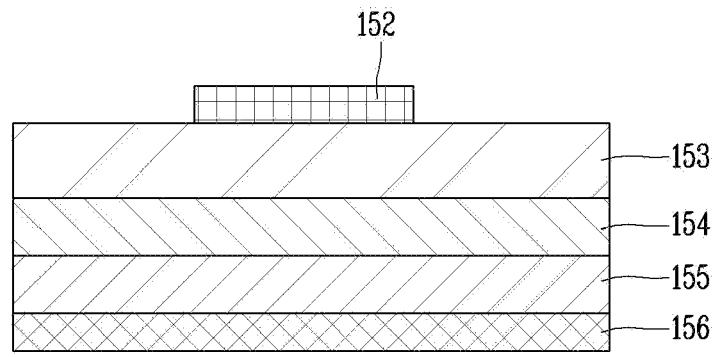
FIG. 3 is an enlarged view of a semiconductor light-emitting device of FIG. 2.
Figure 4:
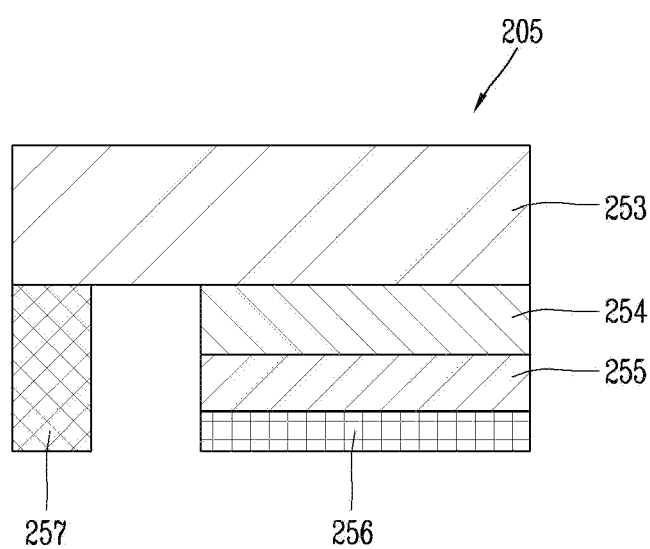
FIG. 4 is an enlarged view illustrating another implementation of a semiconductor light-emitting device of FIG. 2.

FIG. 1 is a conceptual view illustrating a display device using a semiconductor light-emitting device (diode) according to one implementation of the present disclosure, FIG. 2 is an enlarged view of a portion "A" of the display device in FIG. 1, FIG. 3 is an enlarged view of a semiconductor light-emitting device of FIG. 2, and FIG. 4 is an enlarged view illustrating another implementation of a semiconductor light-emitting device of FIG. 2.

As illustrated, information processed in a control unit (or controller) of a display device 100 may be displayed on a display module 140. A case with a closed-loop shape surrounding an edge of the display module 140 may form a bezel of the display device 100.

The display module 140 may include a panel 141 on which an image is displayed, and the panel 141 may include semiconductor light-emitting devices 150 with a micro size and a wiring substrate (or wiring board) 110 on which the semiconductor light-emitting devices 150 are mounted.

A wiring is formed on the wiring substrate 110 so as to be connected to an n-type electrode 152 and a p-type electrode 156 of the semiconductor light-emitting device 150. This may allow the semiconductor light-emitting devices 150 to be provided on the wiring substrate 110 as self-emitting individual pixels.

An image displayed on the panel 141 is visual information, which is achieved by independently controlling light emission of sub-pixels arranged in the form of matrix through the wiring.

The present disclosure exemplarily illustrates a micro light-emitting diode (micro-LED) as one type of the semiconductor light-emitting device 150 that converts current into light. The micro-LED may be a light-emitting diode with a small size of 100 microns or less. The semiconductor light-emitting devices 150 may be provided in blue, red, and green light-emitting regions, respectively, to define a sub-pixel by a combination thereof. That is, the sub-pixel denotes a minimum unit for realizing one color, and at least three micro-LEDs may be provided in the sub-pixel.

More specifically, the semiconductor light-emitting device 150 may have a vertical structure as illustrated in FIG. 3.

For example, each of the semiconductor light-emitting devices 150 may be implemented as a high-power light-emitting device that emits various light colors including blue in a manner that gallium nitride (GaN) is mostly used, and indium (In) and/or aluminum (Al) are added thereto.

The vertical type semiconductor light-emitting device may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. Here, the p-type electrode 156 located at the bottom may be electrically connected to a p-electrode of the wiring substrate 110, and the n-type electrode 152 located at the top may be electrically connected to an n-electrode at an upper side of the semiconductor light-emitting device. The electrodes may be disposed in an up and down direction in the vertical type semiconductor light-emitting device 150 to thereby provide a great advantage of reducing the chip size.

Alternatively, referring to FIG. 4, the semiconductor light-emitting device may be a flip chip type light-emitting device.

For example, a semiconductor light-emitting device 205 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 257 disposed on the n-type semiconductor layer 253 with being spaced apart from the p-type electrode 256 in a horizontal direction. Here, both the p-type electrode 256 and the n-type electrode 257 may be electrically connected to the p-electrode and the n-electrode of the wiring substrate 110 at the bottom of the semiconductor light-emitting device 205.

Each of the vertical type semiconductor light-emitting device and the horizontal type semiconductor light-emitting device may be a green semiconductor light-emitting device, a blue semiconductor light-emitting device, or a red semiconductor light-emitting device. The green semiconductor light-emitting device and the blue semiconductor light-emitting device may each be implemented as a high-power light-emitting device that emits green or blue light in a manner that gallium nitride (GaN) is mostly used, and indium (In) and/or aluminum (Al) are added thereto. As an example, the semiconductor light-emitting device may be a gallium nitride thin film consisting of various layers such as n-Gan, p-Gan, AlGaN, InGan, and the like. More specifically, the p-type semiconductor layer may be P-type GaN, and the n-type semiconductor layer may be N-type GaN. In the case of the red semiconductor light-emitting device, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the semiconductor light-emitting devices described above may be semiconductor light-emitting devices without an active layer.

Referring to FIGS. 1 to 4, since the light-emitting diode is very small, the display panel may be configured such that self-emitting sub-pixels are arranged at fine pitch, thereby achieving a high-definition display device.

In a display device using the semiconductor light-emitting devices of the present disclosure, a semiconductor light-emitting device grown on a wafer and formed by mesa and isolation is used as an individual pixel. Here, the semiconductor light-emitting device 150 with the micro size should be transferred onto the wafer at a predetermined position on the substrate of the display panel. Pick and place is one example of those transfer techniques, which has a low success rate and requires much time. As another example, a technique of transferring several devices at once using a stamp or a roll can be used, which is poor in yield and is not suitable for a large screen display. Therefore, the present disclosure provides a new method for manufacturing a display device that can address these problems and a manufacturing device therefor.

A new method for manufacturing a display device will be described first. FIGS. 5A to 5E are conceptual views illustrating a new process of fabricating the semiconductor light-emitting device described above.

The present disclosure exemplarily illustrates a display device using a passive matrix (PM) type semiconductor light-emitting device. However, an example described hereinafter may also be applied to an active matrix (AM) type semiconductor light-emitting device. In addition, the present disclosure exemplarily illustrates self-assembly of horizontal semiconductor light-emitting devices, but it is equally applicable to self-assembly of vertical semiconductor light-emitting devices.

Figure 5A:
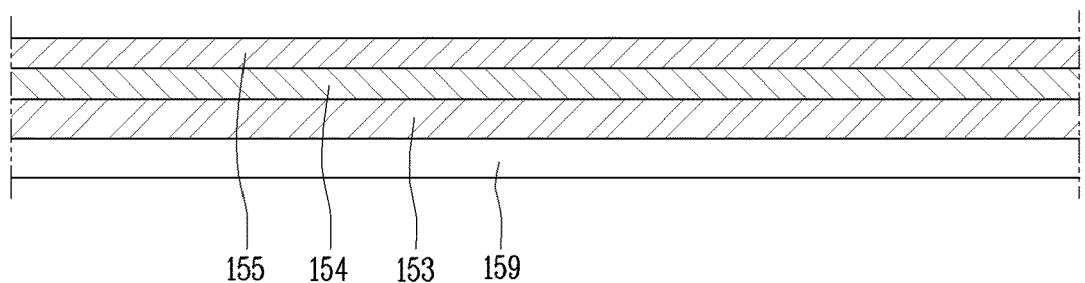
FIGS. 5A to 5E are conceptual views illustrating a new process of fabricating the semiconductor light-emitting device.

According to a manufacturing method, a first conductive semiconductor layer 153, an active layer 154, and a second conductive semiconductor layer 155 are grown on a growth substrate 159 (FIG. 5A).

When the first conductive semiconductor layer 153 is grown, the active layer 154 is grown on the first conductive semiconductor layer 253, then the second conductive semiconductor layer 155 is grown on the active layer 154. As such, when the first conductive semiconductor layer 153, the active layer 154, and the second conductive semiconductor layer 155 are sequentially grown, the first conductive semiconductor layer 153, the active layer 154, and the second conductive semiconductor layer 155 form a layered structure as illustrated in FIG. 5A.

Here, the first conductive semiconductor layer 153 may be a p-type semiconductor layer, and the second conductive semiconductor layer 155 may be an n-type semiconductor layer. However, the present disclosure is not necessarily limited thereto, and the first conductive semiconductor layer 153 may be an n-type semiconductor layer, and the second conductive semiconductor layer 155 may be a p-type semiconductor layer.

In addition, this implementation exemplarily illustrates a case in which the active layer 154 is present. However, in some cases, a structure without the active layer 154 is also possible as described above. For example, the p-type semiconductor layer may be P-type GaN doped with Mg, and the n-type semiconductor layer may be N-type GaN doped with Si.

The growth substrate (wafer) may be formed of a material having optical transparency (or transmittance), such as sapphire (Al2O3), GaN, ZnO, and AlO, but the present disclosure is not limited thereto. In addition, the growth substrate 159 may be made of a material suitable for growing a semiconductor material, namely, a carrier wafer. The growth substrate 159 may be formed of a material having high thermal conductivity, and use, for example, a SiC substrate having higher thermal conductivity than a sapphire (Al2O3) substrate, or Si, GaAs, GaP, and InP, in addition to a conductive substrate or an insulating substrate.

Figure 5B:
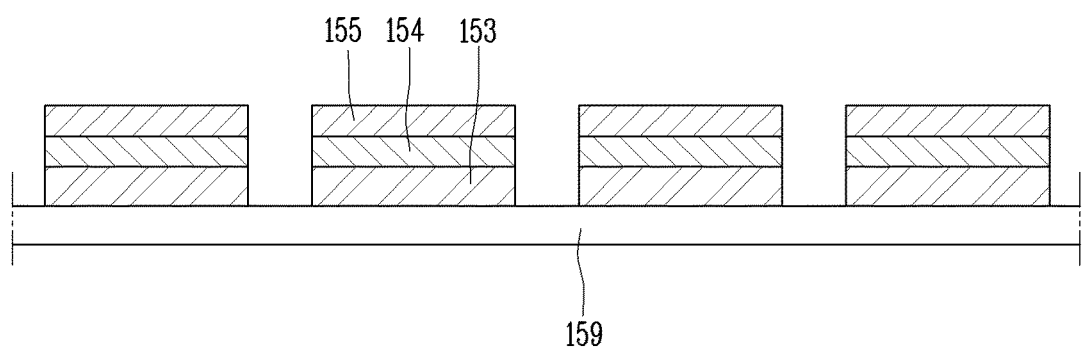

Next, at least portions or parts of the first conductive semiconductor layer 153, the active layer 154, and the second conductive semiconductor layer 155 are removed to form a plurality of semiconductor light-emitting devices (FIG. 5B).

More specifically, isolation is carried out such that the plurality of light-emitting devices form an array of light-emitting devices. That is, the first conductive semiconductor layer 153, the active layer 154, and the second conductive semiconductor layer 155 are etched in a vertical direction to form a plurality of semiconductor light-emitting devices.

In case the horizontal type semiconductor light-emitting device is formed in this step, the active layer 154 and the second conductive semiconductor layer 155 may be partially removed in the vertical direction to perform a mesa process in which the first conductive semiconductor layer 153 is exposed to the outside, and then an isolation process in which the first conductive semiconductor layer 153 is etched to form a plurality of semiconductor light-emitting device arrays.

Figure 5C:
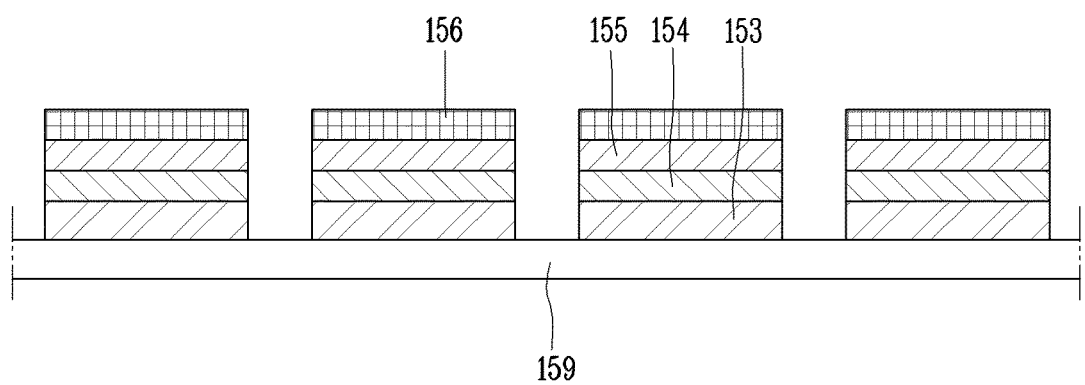

Next, a second conductive electrode 156 or p-type electrode is formed on one surface of each of the second conductive semiconductor layers 155 (FIG. 5C). The second conductive electrode 156 may be formed by a deposition method such as sputtering, but the present disclosure is not limited thereto. However, when the first conductive semiconductor layer 153 and the second conductive semiconductor layer 155 are an n-type semiconductor layer and a p-type semiconductor layer, respectively, the second conductive electrode 156 may be an n-type electrode.

Figure 5D:
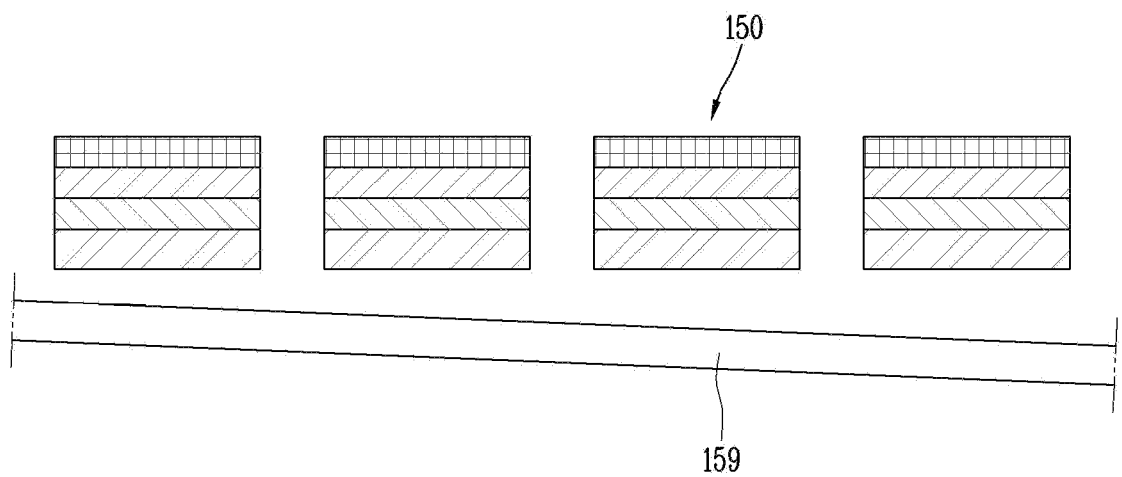

Then, the growth substrate 159 is removed to have the plurality of semiconductor devices. For example, the growth substrate 159 may be removed using a laser lift-off (LLO) or chemical lift-off (CLO) method (FIG. 5D).

Figure 5E:
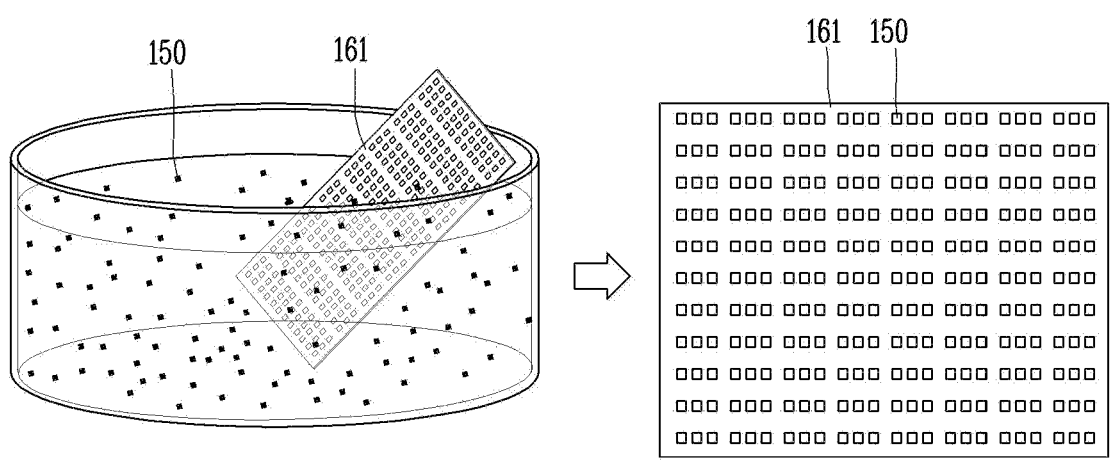

After that, the plurality of semiconductor light-emitting devices 150 are placed onto a substrate in a chamber filled with a fluid (FIG. 5E).

For example, the semiconductor light-emitting devices 150 and a substrate 161 are put into a chamber filled with a fluid, such that the semiconductor light-emitting devices 150 are self-assembled onto the substrate 161 using the flow, gravity, surface tension, and the like. Here, the substrate 161 may be an assembly substrate.

As another example, a wiring substrate, instead of the assembly substrate, may be put into the fluid chamber to allow the semiconductor light-emitting devices 150 to be directly seated on the wiring substrate. In this case, the substrate may be a wiring substrate. However, for the sake of convenience of explanation, the present disclosure exemplarily illustrates the case in which the substrate 161 is an assembly substrate on which the semiconductor light-emitting devices 150 are seated.

In order to allow the semiconductor light-emitting devices 150 to be easily placed onto the substrate 161, the substrate 161 may be provided with cells (not shown) into which the semiconductor light-emitting devices 150 are fitted. In detail, the cells into which the semiconductor light-emitting devices 150 are placed are formed at the substrate 161 in positions where the semiconductor light-emitting devices 150 are aligned with wiring electrodes. The semiconductor light-emitting devices 150 are assembled to the cells while moving in the fluid.

After the plurality of semiconductor light-emitting devices 150 are arrayed on the assembly substrate 161, the semiconductor light-emitting devices 150 of the assembly substrate 161 are transferred onto a wiring substrate, enabling large-area transfer. Therefore, the assembly substrate 161 may be referred to as a temporary substrate.

Meanwhile, the self-assembly described above requires increased transfer efficiency and transfer yield to be applied to the manufacture of a large screen display. The present disclosure provides a self-assembly apparatus (or device) and method that can minimize the influence of gravity or frictional force and prevent non-specific binding to increase the transfer yield.

To this end, in the display device according to the present disclosure, semiconductor light-emitting devices including magnetic materials are used to cause the semiconductor light-emitting devices to move by a magnetic force, and an electric field is used to allow the semiconductor light-emitting devices to be placed at predetermined positions while moving. Hereinafter, such a transfer method and apparatus will be described in more detail with the accompanying drawings.

Figure 6:
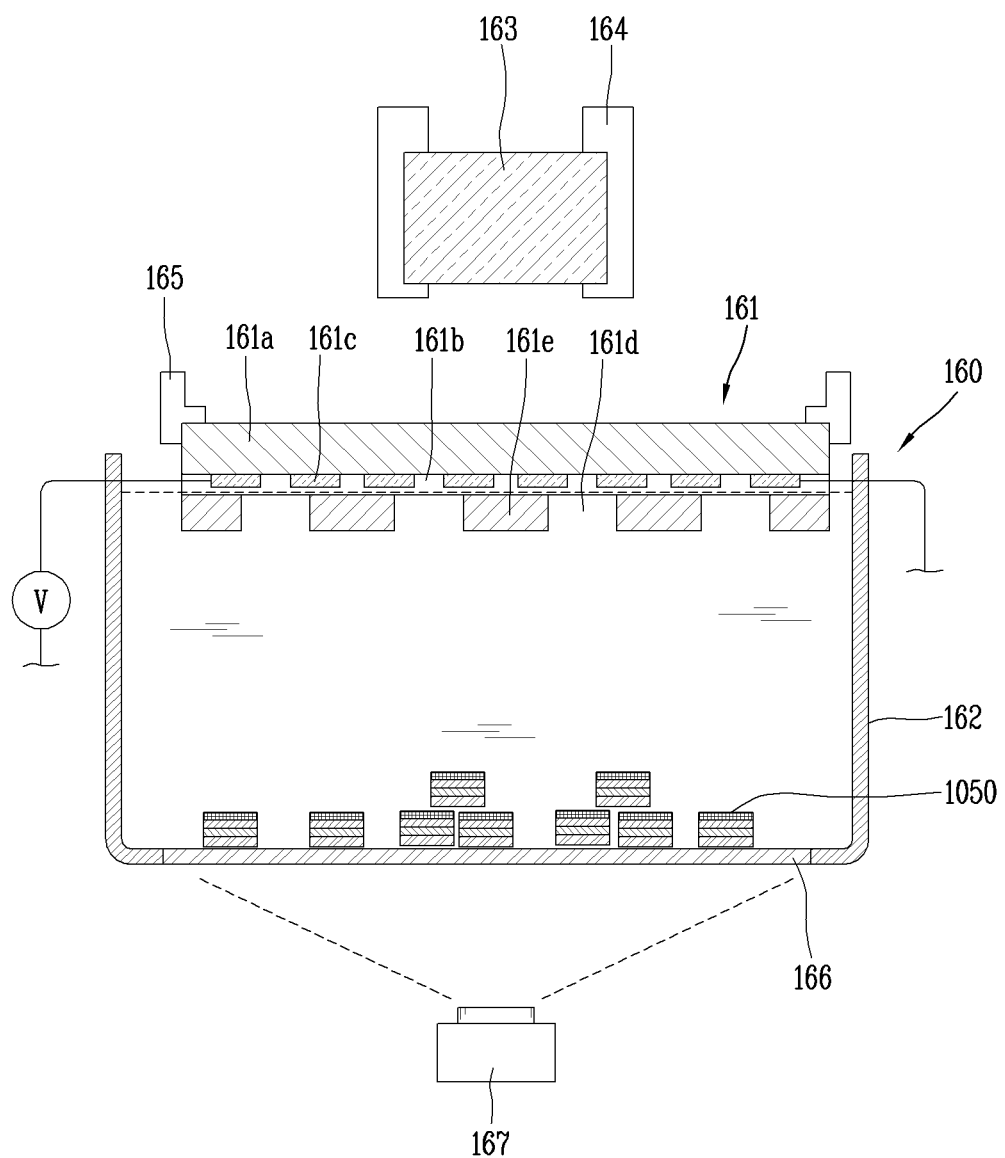
FIG. 6 illustrates a self-assembly apparatus for semiconductor light-emitting devices according to one implementation of the present disclosure.
Figure 7:
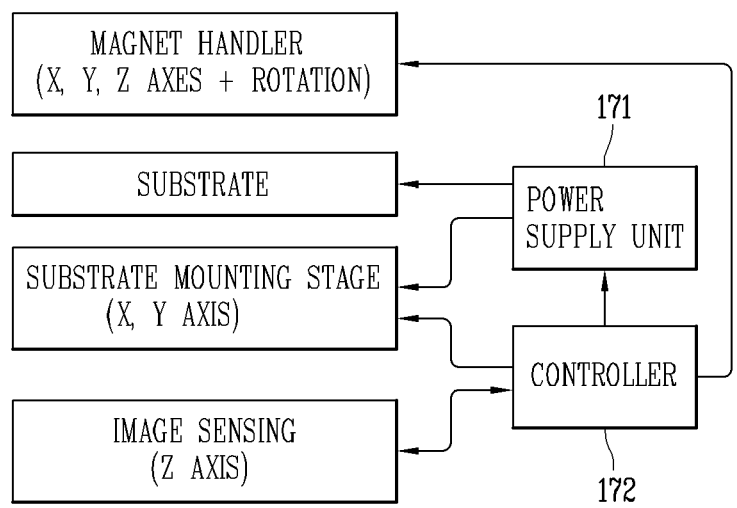
FIG. 7 is a block diagram of the self-assembly apparatus of FIG. 6.
Figure 8A:
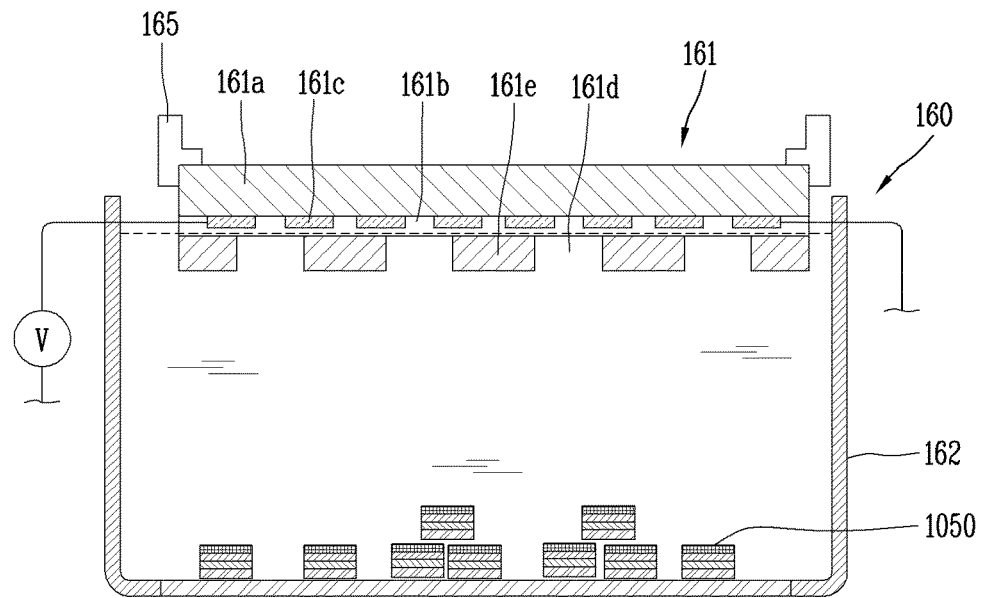
FIGS. 8A to 8E are conceptual views illustrating a self-assembly process of semiconductor light-emitting devices using the self-assembly apparatus of FIG. 6.
Figure 8B:
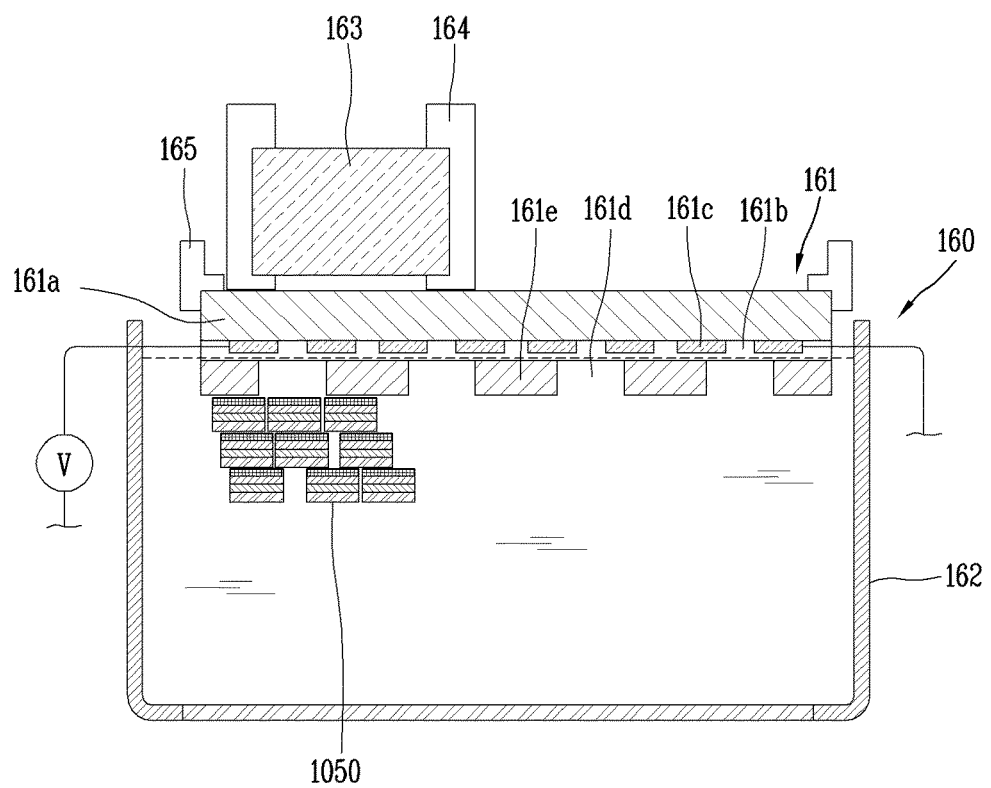
Figure 8C:
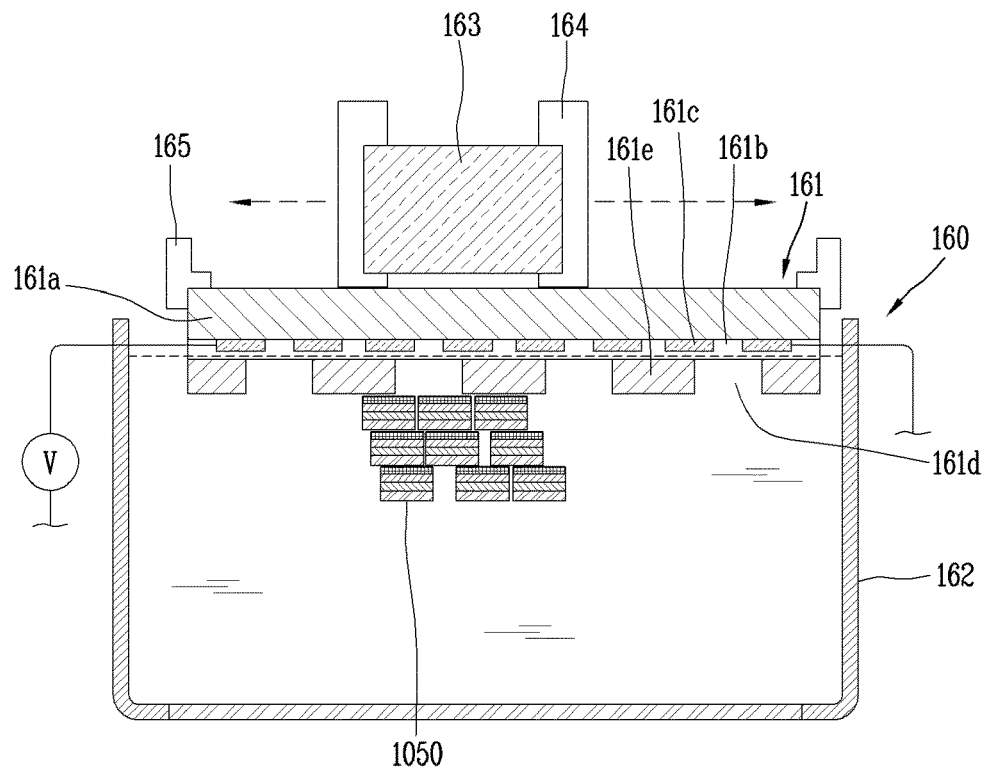
Figure 8D:
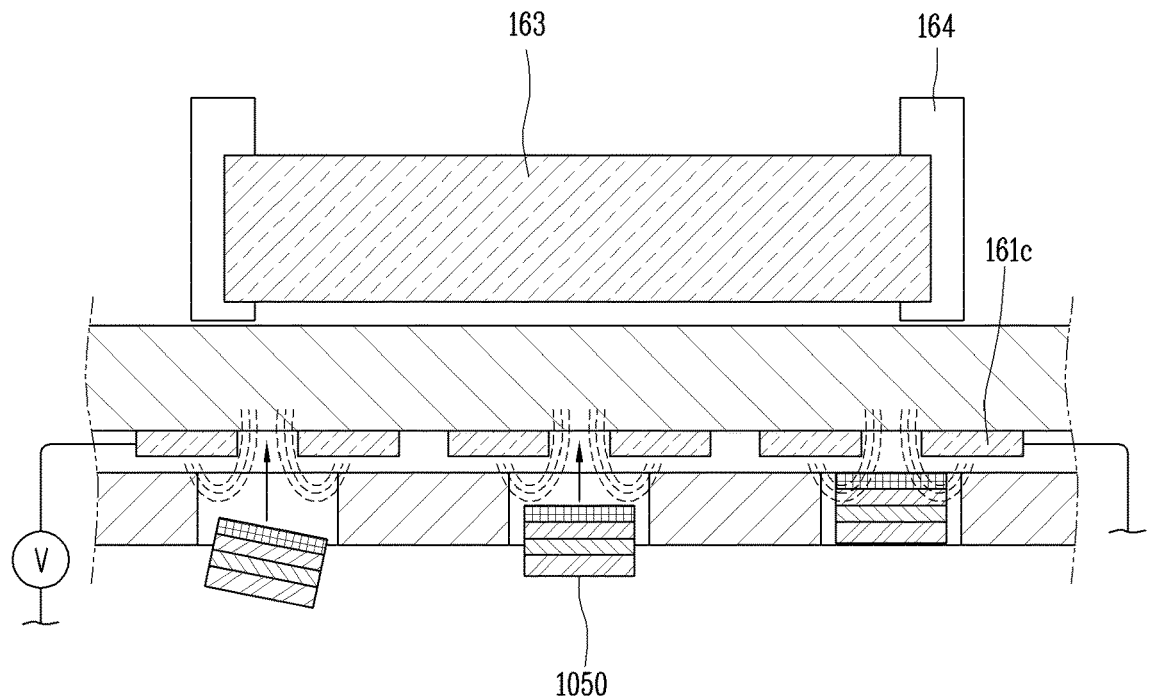
Figure 8E:
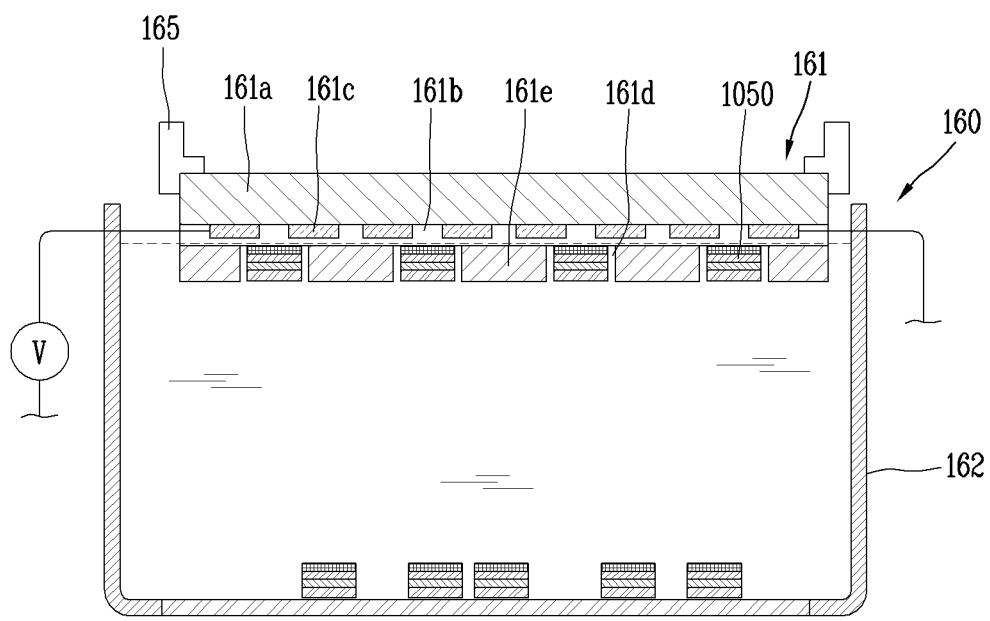
Figure 9:
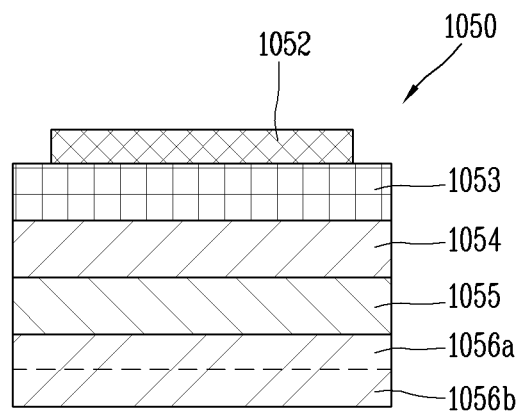
FIG. 9 is a conceptual view illustrating the semiconductor light-emitting devices of FIGS. 8A to 8E.

FIG. 6 illustrates a self-assembly apparatus for semiconductor light-emitting devices according to one implementation of the present disclosure, FIG. 7 is a block diagram of the self-assembly apparatus of FIG. 6, FIGS. 8A to 8E are conceptual views illustrating a self-assembly process of semiconductor light-emitting devices using the self-assembly apparatus of FIG. 6, and FIG. 9 is a conceptual view illustrating the semiconductor light-emitting devices of FIGS. 8A to 8E.

As illustrated in FIGS. 6 and 7, a self-assembly apparatus 160 of the present disclosure may include a fluid chamber 162, a magnet 163, and a position controller 164.

The fluid chamber 162 has a space for accommodating a plurality of semiconductor light-emitting devices 1050. The space may be filled with a fluid. The fluid, which is an assembly solution, may include water and the like. Accordingly, the fluid chamber 162 may be a water tank (or tub) and be configured as an open type. However, the present disclosure is not limited thereto, and the fluid chamber 162 may alternatively be a closed type in which the space is implemented as a closed space.

The substrate 161 may be disposed at the fluid chamber 162 in a manner that an assembly surface thereof to which the semiconductor light-emitting devices 1050 are assembled faces downward. For example, the substrate 161 may be transferred to an assembly position by a transfer unit, and the transfer unit may include a stage 165 to which the substrate is mounted. A position of the stage 165 may be adjusted by a control unit, allowing the substrate 161 to be transferred to the assembly position.

In the assembly position, the assembly surface of the substrate 161 faces the bottom of the fluid chamber 162. As illustrated, the assembly surface of the substrate 161 is disposed to be immersed in the fluid of the fluid chamber 162. Accordingly, the semiconductor light-emitting devices 1050 move to the assembly surface in the fluid.

The substrate 161, which is an assembly substrate capable of producing an electric field, may include a base part 161a, a dielectric layer 161b, and a plurality of electrodes 161c.

The base part 161a may be made of an insulating material, and the plurality of electrodes 161c may be thin or thick film bi-planar electrodes patterned on one surface of the base part 161a. The electrode 161c may be formed of, for example, a stack of Ti/Cu/Ti, Ag paste, or indium tin oxide (ITO).

The dielectric layer 161b may be made of an inorganic material such as $SiO_2$, $SiNx$, $SiON$, $Al_2O_3$, $TiO_2$, $HfO_2$, and the like. Alternatively, the dielectric layer 161b may be formed of a single or multi-layered organic insulator. The dielectric layer 161b may have a thickness in the range of several tens of nm to several μm.

Further, the substrate 161 according to the present disclosure includes a plurality of cells 161d partitioned by partition walls 161e. The cells 161d may be sequentially arranged in one direction and be made of a polymer material. The partition walls 161e defining the cells 161d may be shared with neighboring or adjacent cells 161d. The partition walls 161e may protrude from the base part 161a, and the cells 161d may be sequentially disposed along one direction by the partition walls 161e. More specifically, the cells 161d may be sequentially arranged in column and row directions and have a matrix structure.

As illustrated, the cells 161d may each include a groove for accommodating the semiconductor light-emitting device 150, and the grooves may be spaces defined by the partition walls 161e. A shape of the groove may be the same as or similar to a shape of the semiconductor light-emitting device. For example, when the semiconductor light-emitting device has a rectangular shape, the groove may also have a rectangular shape. Alternatively, although not shown, when the semiconductor light-emitting device has a circular shape, the groove formed in each of the cells may also have a circular shape. Further, each of the cells is configured to accommodate a single semiconductor light-emitting device. That is, one semiconductor light-emitting device is accommodated in one cell.

Meanwhile, the plurality of electrodes 161c may include a plurality of electrode lines disposed at the bottom of the cells 161d, respectively, and the plurality of electrode lines may extend to adjacent cells.

The plurality of electrodes 161c are disposed below the cells 161d, and different polarities are applied thereto to produce an electric field in the cells 161d. In order to produce the electric field, the dielectric layer 161b may cover the plurality of electrodes 161c to define the bottom of the cells 161d. In this structure, when different polarities are applied to a pair of electrodes 161c below the cells 161d, an electric field is produced, which allows the semiconductor light-emitting devices to be inserted into the cells 161d, respectively.

In the assembly position, the electrodes of the substrate 161 are electrically connected to a power supply unit 171. The power supply unit 171 applies power to the plurality of electrodes to generate the electric field.

As illustrated, the self-assembly apparatus 160 may include the magnet 163 for applying a magnetic force to the semiconductor light-emitting devices 1050. The magnet 163 is spaced apart from the fluid chamber 162 and configured to apply a magnetic force to the semiconductor light-emitting devices 150. The magnet 163 may be disposed to face a surface opposite to the assembly surface of the substrate 161, and a position of the magnet may be controlled by the position controller 164 that is connected to the magnet 163.

The semiconductor light-emitting device 1050 may include a magnetic material or substance to move in the fluid by the magnetic field of the magnet 163.

Referring to FIG. 9, the semiconductor light-emitting device 1050 including a magnetic material has a first conductive electrode 1052, a second conductive electrode 1056, a first conductive semiconductor layer 1053 on which the first conductive electrode 1052 is disposed, a second conductive semiconductor layer 1055 overlapping the first conductive semiconductor layer 1052 and beneath which the second conductive electrode 1056 is disposed, and an active layer 1054 disposed between the first and second conductive layers 1053 and 1055.

Here, the first conductive type may be a p-type and the second conductive type may be an n-type, and vice versa. As described above, a semiconductor light-emitting device without the active layer may also be available.

In the present disclosure, the first conductive electrode 1052 may be formed after the self-assembly of the semiconductor light-emitting devices on the wiring substrate. In addition, in the present disclosure, the second conductive electrode 1056 may include the magnetic material. The magnetic material may mean a magnetic metal. The magnetic material may be Ni, SmCo, or the like. Alternatively, the magnetic material may correspond to at least one of Gd-based, La-based, and Mn-based materials.

The magnetic material may be provided on the second conductive electrode 1056 in the form of particles. Alternatively, a conductive electrode including a magnetic material may be formed such that one layer of the conductive electrode may be made of a magnetic material. For example, as illustrated in FIG. 9, the second conductive electrode 1056 of the semiconductor light-emitting device 1050 may include a first layer 1056a and a second layer 1056b. Here, the first layer 1056a may include a magnetic material, and the second layer 1056b may include a non-magnetic metal material.

As illustrated, in this implementation, the first layer 1056a including the magnetic material may be disposed to be in contact with the second conductive semiconductor layer 1055. In this case, the first layer 1056a is disposed between the second layer 1056b and the second conductive semiconductor layer 1055. The second layer 1056b may be a contact metal connected to the second electrode of the wiring substrate. However, the present disclosure is not limited thereto, and the magnetic material may be disposed on one surface of the first conductive semiconductor layer.

Referring back to FIGS. 6 and 7, more specifically, the self-assembly apparatus may include a magnet handler that can automatically or manually moved in x, y, and z axes above the fluid chamber, or a motor capable of rotating the magnet 163. The magnet handler and the motor may constitute the position controller 164, allowing the magnet 163 to rotate in a horizontal direction, a clockwise direction, or a counterclockwise direction with respect to the substrate 161.

Meanwhile, a bottom plate 166 that is light transmissive or transparent may be defined in the fluid chamber 162, and the semiconductor light-emitting devices 1050 may be disposed between the bottom plate 166 and the substrate 161. An image sensor 167 may be disposed to face the bottom plate 166 to monitor the inside of the fluid chamber 162 through the bottom plate 166. The image sensor 167 may be controlled by the control unit 172 and include an inverted type lens and a CCD through which the assembly surface of the substrate 161 can be observed.

The self-assembly apparatus is configured to use a combination of a magnetic field and an electric field. The electric field allows the semiconductor light-emitting devices to be seated at predetermined positions of the substrate while moving according to a change in position of the magnet. Hereinafter, an assembly process using the self-assembly apparatus will be described in more detail.

First, a plurality of semiconductor light-emitting devices 1050 including magnetic materials are formed through the process described with reference to FIGS. 5A to 5C. Here, the magnetic material may be deposited on the semiconductor light-emitting device during the process of forming the second conductive electrode of FIG. 5C.

Then, a substrate 161 is transferred to an assembly position, and the semiconductor light-emitting devices 1050 are put into a fluid chamber 162 (FIG. 8A).

As described above, the assembly position of the substrate 161 may be a position disposed at the fluid chamber 162 in a manner that an assembly surface of the substrate 161 to which the semiconductor light-emitting devices 1050 are assembled faces downward.

In this case, some of the semiconductor light-emitting devices 1050 may sink to the bottom of the fluid chamber 162 and another some of the semiconductor light-emitting devices 1050 may float in the fluid. When a bottom plate 166 that is light transmissive is provided in the fluid chamber 162, some of the semiconductor light-emitting devices 1050 may sink to the bottom plate 166.

Next, a magnetic force is applied to the semiconductor light-emitting devices 1050 so that the semiconductor light-emitting devices 1050 vertically float in the fluid chamber 162 (FIG. 8B).

When a magnet 163 of the self-assembly apparatus moves from its original position to an opposite surface of the assembly surface of the substrate 161, the semiconductor light-emitting devices 1050 float toward the substrate 161 in the fluid. The original position may be a position deviated from the fluid chamber 162. As another example, the magnet 163 may be configured as an electromagnet. In this case, electricity is supplied to the electromagnet to generate an initial magnetic force.

Meanwhile, in this example, when a magnitude of the magnetic force is adjusted, a separation distance between the assembly surface of the substrate 161 and the semiconductor light-emitting devices 1050 may be controlled. For example, the separation distance is controlled by using the weight, buoyancy, and magnetic force of the semiconductor light-emitting devices 1050. The separation distance may be several millimeters to several tens of micrometers from the outermost surface of the substrate.

Next, a magnetic force is applied to the semiconductor light-emitting devices 1050 to cause the semiconductor light-emitting devices 1050 to move in one direction in the fluid chamber 162. For example, the magnet 163 is moved in a direction parallel to the substrate, a clockwise direction, or a counterclockwise direction (FIG. 8C). The semiconductor light-emitting devices 1050 move in a direction parallel to the substrate 161 by the magnetic force at a position spaced apart from the substrate 161.

Then, an electric field is applied to guide the semiconductor light-emitting devices 1050 to predetermined positions during the movement of the semiconductor light-emitting devices 1050, such that the semiconductor light-emitting devices 1050 are placed at the predetermined positions of the substrate 161 (FIG. 8C). For example, the semiconductor light-emitting devices 1050 moving in a direction horizontal to the substrate 161 are moved in a direction perpendicular (or vertical) to the substrate 161 by the electric field, allowing the semiconductor light-emitting devices 1050 to be seated at the predetermined positions.

More specifically, power is supplied to bi-planar electrodes of the substrate 161 to produce an electric field, so as to induce or enable the semiconductor light-emitting devices 1050 to be assembled only at the predetermined positions. That is, the selectively produced electric field allows the semiconductor light-emitting devices 1050 to be self-assembled at the assembly positions of the substrate 161. To this end, cells into which the semiconductor light-emitting devices 1050 are fitted may be provided at the substrate 161.

Then, unloading of the substrate 161 is performed, and the assembly process is completed. When the substrate 161 is an assembly substrate, a post-process for transferring arrayed semiconductor light-emitting devices to a wiring substrate to achieve a display device may be carried out, as described above.

Meanwhile, after guiding the semiconductor light-emitting devices 1050 to the predetermined positions, the magnet may be moved to a direction away from the substrate 161 such that the semiconductor light-emitting devices 1050 remaining in the fluid chamber 162 fall to the bottom of the fluid chamber 162 (FIG. 8D). As another example, in the case of the magnet 163 implemented as an electromagnet, the semiconductor light-emitting devices 1050 remaining in the fluid chamber 162 drop to the bottom of the fluid chamber 162 when power supply is stopped.

Then, the semiconductor light-emitting devices 1050 on the bottom of the fluid chamber 162 are collected to be reduced.

In the self-assembly apparatus and method described above, a magnetic field is applied to cause parts or components located distant to be placed near a predetermined assembly site to increase the assembly yield in fluidic assembly, and then an additional electric field is applied to the assembly site to allow the parts to be selectively assembled only onto the assembly site. Here, the assembly substrate is placed at an upper portion of the water tank and the assembly surface thereof is directed downward to minimize the influence of gravity due to weight of the parts and to prevent non-specific binding to thereby eliminate defects. That is, in order to increase the transfer yield, the assembly substrate is placed at the top to minimize the influence of gravity or frictional force, and to prevent non-specific binding.

With this configuration, in a display device in which individual pixels are implemented as semiconductor light-emitting devices, a large number of semiconductor light-emitting devices can be assembled at once.

As such, according to the present disclosure, a large number of semiconductor light-emitting devices can be pixelated on a small-sized wafer to be transferred onto a large-area substrate. Thus, a large-area display device can be manufactured at a low cost.

Meanwhile, the present disclosure provides a structure and method for an assembly substrate to increase the self-assembly process yield and the process yield after the self-assembly. The present disclosure is limited to when the substrate 161 is used as an assembly substrate. That is, the assembly substrate described later is not used as a wiring substrate of the display device. Therefore, the substrate 161 will be referred to as an assembly substrate 161 hereinafter.

The present disclosure can improve the process yield in two respects. First, according to the present disclosure, a strong electric field is not produced in an undesirable position, so as to prevent the semiconductor light-emitting devices from being placed at undesirable positions. Second, the present disclosure can prevent the semiconductor light-emitting devices from being remained or left in the assembly substrate when the semiconductor light-emitting devices seated on the assembly substrate are transferred onto another substrate.

The above-described problems cannot be individually achieved by different components. These two problems can be addressed by the organic combination of a component to be described hereinafter and the assembly substrate 161 described above.

Before describing the present disclosure in detail, a post-process for manufacturing a display device after the self-assembly will be described.

Figure 10A:
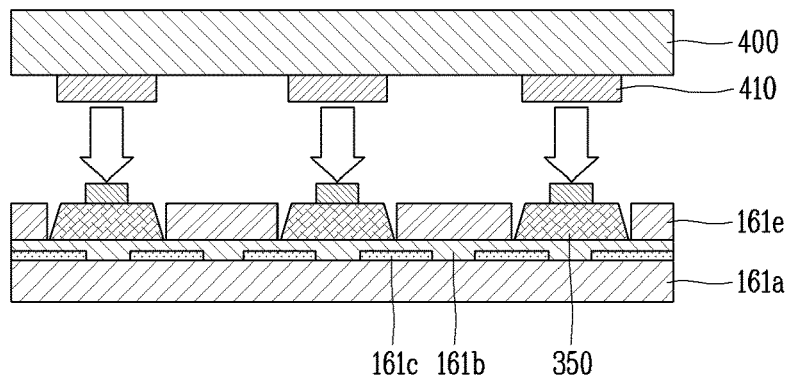
FIGS. 10A to 10C are conceptual views illustrating the transfer of semiconductor light-emitting devices after a self-assembly process according to the present disclosure.
Figure 10B:
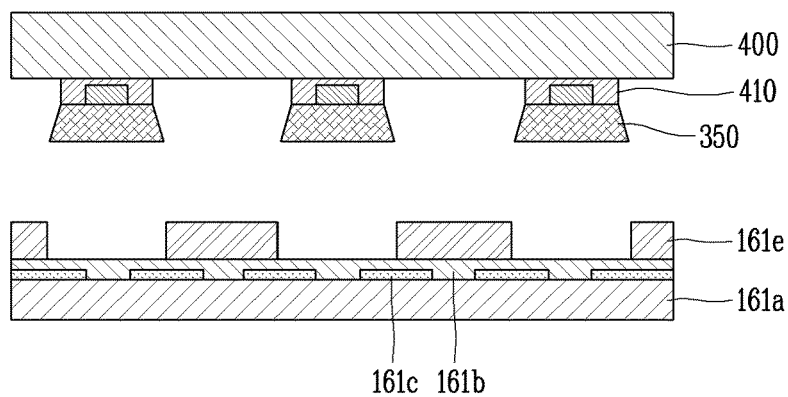
Figure 10C:
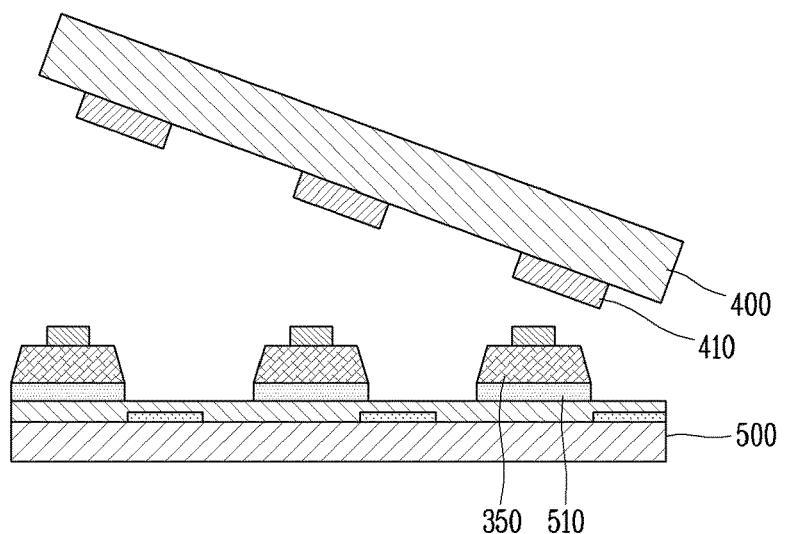

FIGS. 10A to 10C are conceptual views illustrating the transfer of semiconductor light-emitting devices after a self-assembly process according to the present disclosure.

When the self-assembly process described with reference to FIGS. 8A to 8E is completed, the semiconductor light-emitting devices are placed at predetermined positions of the assembly substrate 161. The semiconductor light-emitting devices seated on the assembly substrate 161 are transferred onto another substrate at least once. Herein, an example in which semiconductor light-emitting devices seated on the assembly substrate 161 are transferred twice. However, the present disclosure is not limited thereto, and the semiconductor light-emitting devices placed on the assembly substrate 161 may be transferred onto another substrate once or three times.

Meanwhile, immediately after completing the self-assembly process, the assembly surface of the assembly substrate 161 is facing downward (or the direction of gravity). For the process after the self-assembly process, the assembly substrate 161 may be turned over 180 degrees with the semiconductor light-emitting devices seated thereon. In this process, the semiconductor light-emitting devices may be separated from the assembly substrate 161, a voltage should be applied to the plurality of electrodes 161c (hereinafter, "assembly electrodes") while the assembly substrate 161 is being turned over. An electric field produced between the assembly electrodes prevents the semiconductor light-emitting devices from being separated from the assembly substrate 161 while the assembly substrate 161 is being turned over.

When the assembly substrate 161 is turned over 180 degrees after the self-assembly process, it will be like as shown in FIG. 10A. As illustrated in FIG. 10A, the assembly surface of the assembly substrate 161 faces upward (or a direction opposite to gravity). In this state, a transfer substrate 400 is aligned above the assembly substrate 161.

The transfer substrate 400 is a substrate used for transferring semiconductor light-emitting devices 350 seated on the assembly substrate 161 to a wiring substrate by making the semiconductor light-emitting devices 350 separated or detached from the assembly substrate 161. The transfer substrate 400 may be made of a polydimethylsiloxane (PDMS) material. Accordingly, the transfer substrate 400 may be referred to as a PDMS substrate.

The transfer substrate 400 is aligned with the assembly substrate 161 to be pressed onto the assembly substrate 161. Then, when the transfer substrate 400 is moved above the assembly substrate 161, the semiconductor light-emitting devices 350 disposed on the assembly substrate 161 are moved to the transfer substrate 400 by an adhesive force of the transfer substrate 400.

To this end, surface energy between the semiconductor light-emitting device 350 and the transfer substrate 400 should be higher than surface energy between the semiconductor light-emitting device 350 and the dielectric layer 161b. The greater the difference between the two surface energies, the higher the possibility of separation of the semiconductor light-emitting device 350 from the assembly substrate 161. Therefore, a greater difference between the two surface energies is more advantageous.

The transfer substrate 400 may include a plurality of protrusion portions 410 to allow pressure applied by the transfer substrate 400 to be concentrated on the semiconductor light-emitting devices 350 when the transfer substrate 400 is pressed onto the assembly substrate 161. The protrusion portions 410 may be formed at the same intervals as the semiconductor light-emitting devices 350 seated on the assembly substrate 161. When pressing the transfer substrate 400 onto the assembly substrate 161 after aligning the protrusion portions 410 with the semiconductor light-emitting devices 350 to overlap each other, pressure by the transfer substrate 400 may be concentrated only on the semiconductor light-emitting devices 350. Thus, the present disclosure increases the possibility of separation of the semiconductor light-emitting devices 350 from the assembly substrate 161.

Meanwhile, portions of the semiconductor light-emitting devices 350 may, preferably, be exposed to the outside of grooves in a state the semiconductor light-emitting devices 350 are placed on the assembly substrate 161. When the semiconductor light-emitting devices 350 are not exposed to the outside of the grooves, pressure by the transfer substrate 400 is not concentrated on the semiconductor light-emitting devices 350. This may result in reducing the possibility of separation of the semiconductor light-emitting devices 350 from the assembly substrate 161.

Finally, referring to FIG. 10C, the transfer substrate 400 is pressed onto a wiring substrate 500 to transfer the semiconductor light-emitting devices 350 onto the wiring substrate 500 from the transfer substrate 400. Here, protruding portions 510 may be formed on the wiring substrate 500. The transfer substrate 400 and the wiring substrate 500 are aligned such that the semiconductor light-emitting devices 350 disposed on the transfer substrate 400 and the protruding portions 510 overlap each other. Then, when the transfer substrate 400 and the wiring substrate 500 are pressed against each other, the possibility of separation of the semiconductor light-emitting devices 350 from the transfer substrate 400 can be increased due to the protruding portions 510.

In order for the semiconductor light-emitting devices 350 disposed on the transfer substrate 400 to be transferred onto the wiring substrate 500, surface energy between the semiconductor light-emitting devices 350 and the wiring substrate 500 should be higher than surface energy between the semiconductor light-emitting devices 350 and the transfer substrate 400. The greater the difference between the two surface energies, the higher the possibility of separation of the semiconductor light-emitting device 350 from the transfer substrate 400. Therefore, a greater difference between the two surface energies is more advantageous.

After transferring all the semiconductor light-emitting devices 350 disposed on the transfer substrate 400 to the wiring substrate 500, electrical connection between the semiconductor light-emitting devices 350 and wiring electrodes formed on the wiring substrate 500 may be carried out. A structure of the wiring electrodes and a method of the electrical connection may vary according to a type of the semiconductor light-emitting device 350.

Although not illustrated, an anisotropic conductive film may be disposed on the wiring substrate 500. In this case, an electrical connection can be provided between the semiconductor light-emitting devices 350 and the wiring electrodes formed on the wiring substrate 500 by only pressing the transfer substrate 400 and the wiring substrate 500 against each other.

When manufacturing a display device including semiconductor light-emitting devices that emit light of different colors, the method described with reference to FIGS. 10A to 10C may be implemented in various ways. Hereinafter, a method of manufacturing a display device including semiconductor light-emitting devices emitting red (R), green (G), and blue (B) light will be described.

Figure 11:
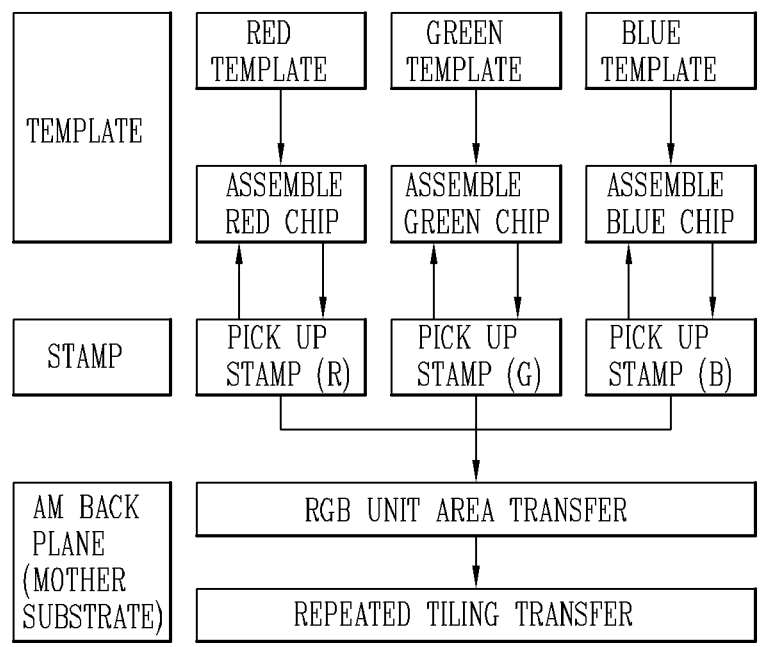
FIGS. 11 to 13 are flowcharts illustrating a method of manufacturing a display device including semiconductor light-emitting devices emitting red (R), green (G), and blue (B) light.
Figure 12:
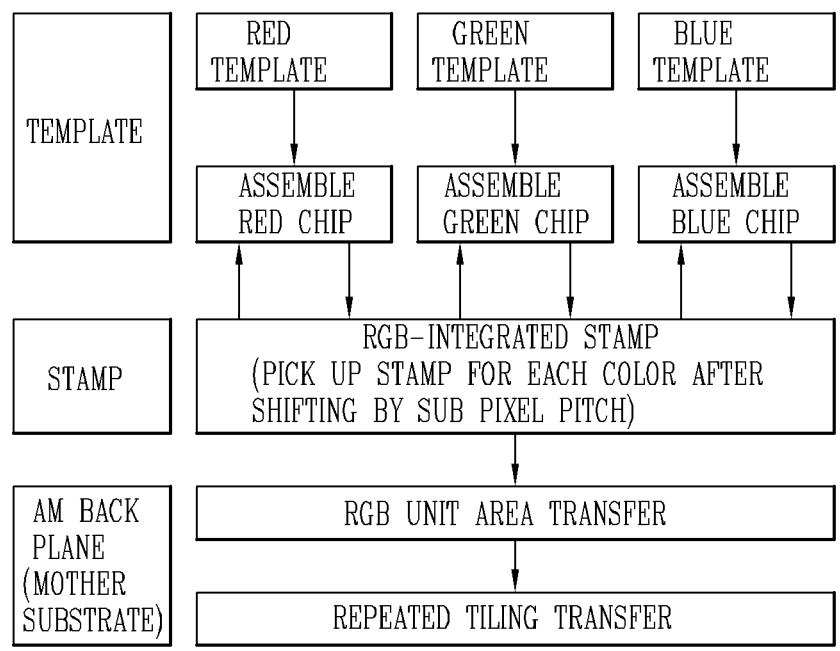
Figure 13:
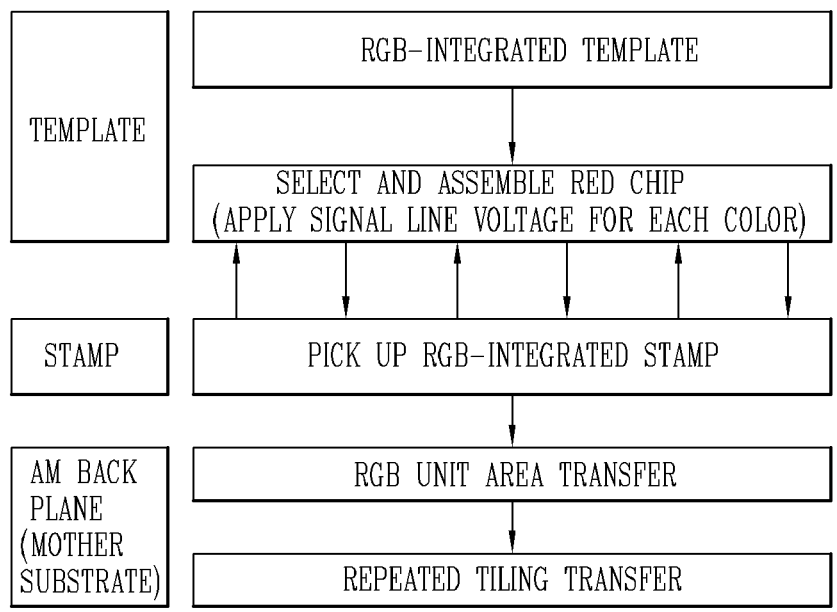

FIGS. 11 to 13 are flowcharts illustrating a method of manufacturing a display device including semiconductor light-emitting devices emitting red (R), green (G), and blue (B) light.

Semiconductor light-emitting devices emitting light of different colors may be individually assembled on different assembly substrates (templates). In detail, the assembly substrate 161 includes a first assembly substrate on which semiconductor light-emitting devices emitting a first color are placed, a second assembly substrate on which semiconductor light-emitting devices emitting a second color different from the first color are placed, and a third assembly substrate on which semiconductor light-emitting devices emitting a third color different from the first and second colors are placed. Different types of semiconductor light-emitting devices are assembled on the respective assembly substrates according to the method described with reference to FIGS. 8A to 8E. For example, the semiconductor light-emitting devices emitting red (R), green (G), and blue (B) light may be assembled on the first to third assembly substrates, respectively.

Referring to FIG. 11, red chips, green chips, and blue chips may be assembled on first to third assembly substrates, namely, a red template, a green template, and a blue template, respectively. In this state, the red chips, the green chips, and the blue chips may be transferred to a wiring substrate by different transfer substrates.

In detail, transferring the semiconductor light-emitting devices seated on the respective assembly substrates to the wiring substrate may include the steps of pressing a first transfer substrate (stamp (R)) onto the first assembly substrate (red template) to transfer semiconductor light-emitting devices emitting the first color (red chips) to the first transfer substrate (stamp (R)) from the first assembly substrate (red template), pressing a second transfer substrate (stamp (G)) onto the second assembly substrate (green template) to transfer semiconductor light-emitting devices emitting the second color (green chips) to the second transfer substrate (stamp (G)) from the second assembly substrate (green template), and pressing a third transfer substrate (stamp (B)) onto the third assembly substrate (blue template) to transfer semiconductor light-emitting devices emitting the third color (blue chips) to the third transfer substrate (stamp (B)) from the third assembly substrate (blue template).

Then, the first to third transfer substrates are pressed onto the wiring substrate, so that the semiconductor light-emitting devices emitting the first to third colors are transferred to the wiring substrate from the respective first to third transfer substrates.

According to the manufacturing method of FIG. 11, three types of assembly substrates and three types of transfer substrates are required to manufacture a display device including red, green, and blue chips.

Unlike this method, referring to FIG. 12, red chips, green chips, and blue chips may be assembled on first to third assembly substrates, namely, a red template, a green template, and a blue template, respectively. In this state, the red chips, the green chips, and the blue chips may be transferred to a wiring substrate by the same transfer substrate.

In detail, transferring the semiconductor light-emitting devices seated on the assembly substrates to the wiring substrate may include the steps of pressing a transfer substrate (RGB integrated stamp) onto the first assembly substrate (red template) to transfer semiconductor light-emitting devices emitting the first color (red chips) to the transfer substrate (RGB integrated stamp) from the first assembly substrate (red template), pressing the transfer substrate (RGB integrated stamp) onto the second assembly substrate (green template) to transfer semiconductor light-emitting devices emitting the second color (green chips) to the transfer substrate (RGB integrated stamp) from the second assembly substrate (green template), and pressing the transfer substrate (RGB integrated stamp) onto the third assembly substrate (blue template) to transfer semiconductor light-emitting devices emitting the third color (blue chips) to the transfer substrate (RGB integrated stamp) from the third assembly substrate (blue template).

Here, alignment positions between the first to third assembly substrates and the transfer substrate may vary. For example, when the assembly substrates and the transfer substrate are aligned with each other, a relative position of the transfer substrate with respect to the first assembly substrate and a relative position of the transfer substrate with respect to the second assembly substrate may be different from each other. The transfer substrate may shift the alignment position by a sub pixel pitch whenever a type of the assembly substrate is changed. In this way, when the transfer substrate is pressed onto the first to third assembly substrates sequentially, all three types of chips may be transferred to the transfer substrate.

Then, as described in FIG. 11, the transfer substrate is pressed onto the wiring substrate such that the semiconductor light-emitting devices emitting the first to third colors are transferred to the wiring substrate from the transfer substrate.

According to the manufacturing method of FIG. 12, three types of assembly substrates and one type of a transfer substrate are required to manufacture a display device including red, green, and blue chips.

Unlike the examples described in FIGS. 11 and 12, according to FIG. 13, all of red chips, green chips, and blue chips may be assembled on one assembly substrate (RGB integrated template). In this state, the red chips, the green chips, and the blue chips may be transferred to a wiring substrate by the same transfer substrate (RGB integrated stamp).

According to the manufacturing method of FIG. 13, one type of an assembly substrate and one type of a transfer substrate are required to manufacture a display device including red, green, and blue chips.

As such, when manufacturing a display device including semiconductor light-emitting devices emitting light of different colors, its manufacturing method may be implemented in various ways.

The present disclosure relates to an assembly substrate having a structure that can improve a transfer rate of semiconductor light-emitting devices to a transfer substrate by differentiating energies acting between a surface of an assembly substrate and a surface of the transfer substrate according to regions of the assembly substrate in the transfer process illustrated in FIGS. 10A to 10C. Hereinafter, various implementations of the present disclosure will be described with reference to the accompanying drawings.

In the following description, a final substrate, which is a substrate used as an actual display panel, may refer to the wiring substrate described above, and a pair electrode may refer to a pair of adjacent assembly electrodes to which different polarities are applied, among a plurality of assembly electrodes formed on the assembly substrate.

First, a structure of the related art assembly substrate used in a method of manufacturing a display device and the form (shape) of an electric field produced in the assembly substrate during self-assembly will be briefly described with reference to FIGS. 14 and 15.

Figure 14:
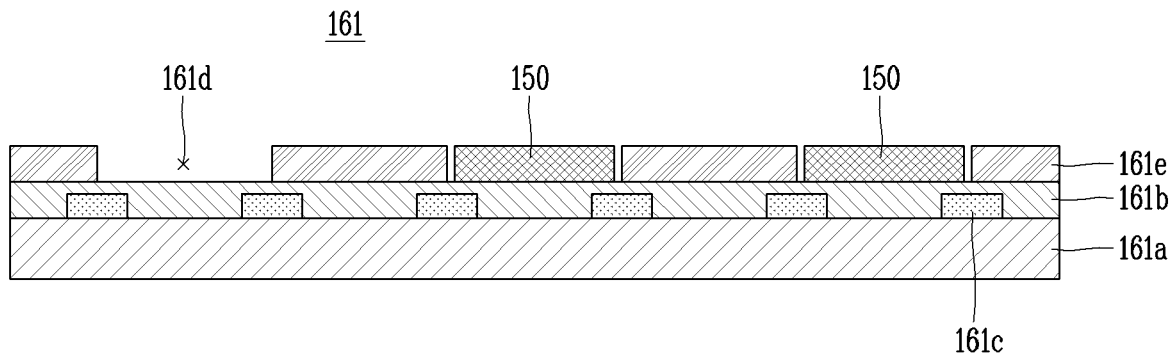
FIG. 14 is a cross-sectional view illustrating a structure of the related art assembly substrate used for manufacturing a display device.
Figure 15:
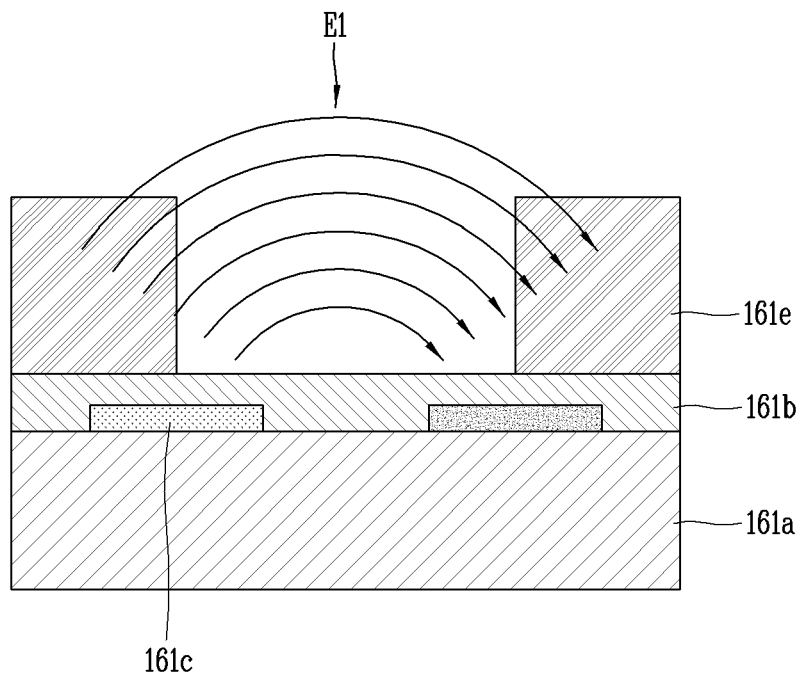
FIG. 15 is a conceptual view illustrating an electric field produced between assembly electrodes.

FIG. 14 is a cross-sectional view illustrating a structure of the related art assembly substrate used for manufacturing a display device, and FIG. 15 is a conceptual view illustrating an electric field produced between assembly electrodes.

An assembly substrate 161 may be a substrate used for a method of manufacturing a display device, and more particularly, a substrate used for a method of manufacturing a display device using self-assembly. Here, the self-assembly may be a display manufacturing method in which semiconductor light-emitting devices are placed at predetermined positions of the assembly substrate 161 using an electric field and a magnetic field.

The conventional assembly substrate 161 may include a base part 161a, a dielectric layer 161b, a plurality of pair electrodes 161c, cells 161d on which semiconductor light-emitting devices 150 are placed, respectively, and partition walls 161e.

The plurality of pair electrodes 161c may extend in one direction and be disposed in parallel on the base part 161a, and the dielectric layer 161b may be stacked or disposed on the base part 161a to cover the plurality of pair electrodes 161c.

The partition walls 161e may be disposed on the dielectric layer 161b. More specifically, the partition walls 161e may be disposed to define the cells 161d at predetermined intervals along the extension direction of the plurality of pair electrodes 161c to overlap portions of the plurality of pair electrodes 161c. The semiconductor light-emitting devices 150 may be placed into the cells 161d, respectively.

When a voltage is applied to the pair electrode 161c from the outside, as shown in FIG. 15, an electric field E1 may be formed inside the cell 161d. The semiconductor light-emitting device 150 may be placed into the cell 161d by the electric field E1. The electric field E1 becomes stronger as it gets closer to the pair electrode 161c and becomes weaker as it gets further away from the pair electrode 161c.

When the self-assembly is completed, a transfer process for transferring the semiconductor light-emitting devices 150 seated on the assembly substrate 161 to a transfer substrate 400 is carried out. The transfer substrate 400 may be pressed onto the assembly substrate 161 for the transfer of the semiconductor light-emitting devices 150.

Figure 16:
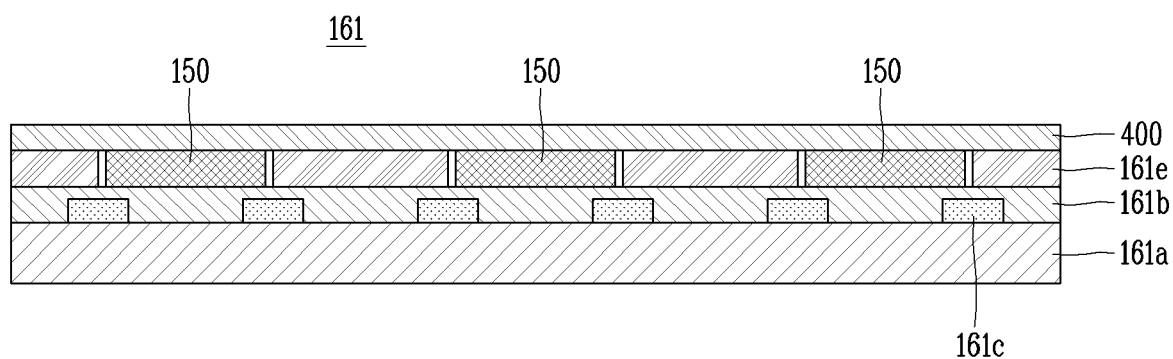
FIG. 16 is a cross-sectional view illustrating a state (transfer process) in which a transfer substrate is pressed onto an assembly substrate of the related art.

FIG. 16 is a cross-sectional view illustrating a state (transfer process) in which a transfer substrate is pressed onto an assembly substrate of the related art. Referring to FIG. 16, the transfer substrate 400 is entirely in contact with an upper surface of the assembly substrate 161 by the compression. The upper surface of the assembly substrate 161 in contact with the transfer substrate 400 may be an upper surface of the partition wall 161e, or a first or second conductive electrode layer of the semiconductor light-emitting device 150 placed into the cell 161d.

In order to efficiently transfer the semiconductor light-emitting devices 150 seated on the assembly substrate 161 to the transfer substrate 400, a contact force of the transfer substrate 400 should be concentrated on a specific portion of the assembly substrate 161, for example, a region of the semiconductor light-emitting device 150.

However, the transfer substrate 400 and the upper surface of the assembly substrate 161 are entirely brought into contact while being pressed against each other, making it difficult to allow a contact force between the transfer substrate 400 and the assembly substrate 161 to be selectively concentrated on the semiconductor light-emitting devices 150.

Therefore, an assembly substrate according to an implementation of the present disclosure may include at least one of a recess (or recessed) portion or a concave and convex portion (or uneven portion) to make a contact force acting between semiconductor light-emitting devices and a transfer substrate, and a contact force acting between the transfer substrate and regions other than the semiconductor light-emitting devices of an assembly substrate different.

Hereinafter, various implementations of an assembly substrate structure according to the present disclosure will be described in detail with reference to FIGS. 17 to 20.

Figure 17A:
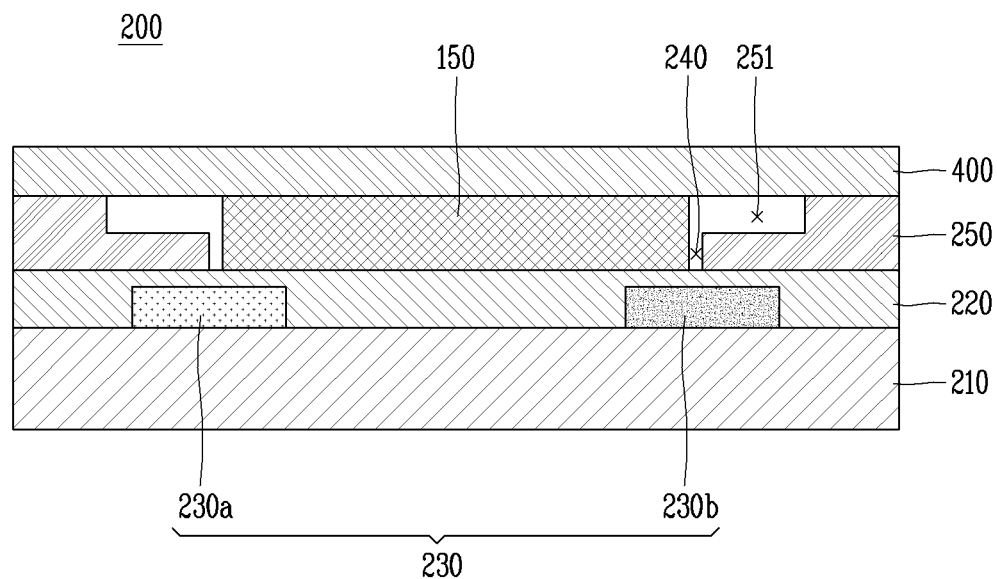
FIGS. 17A to 17C are cross-sectional views illustrating a state (transfer process) in which a transfer substrate is pressed onto an assembly substrate according to one implementation of the present disclosure.
Figure 17B:
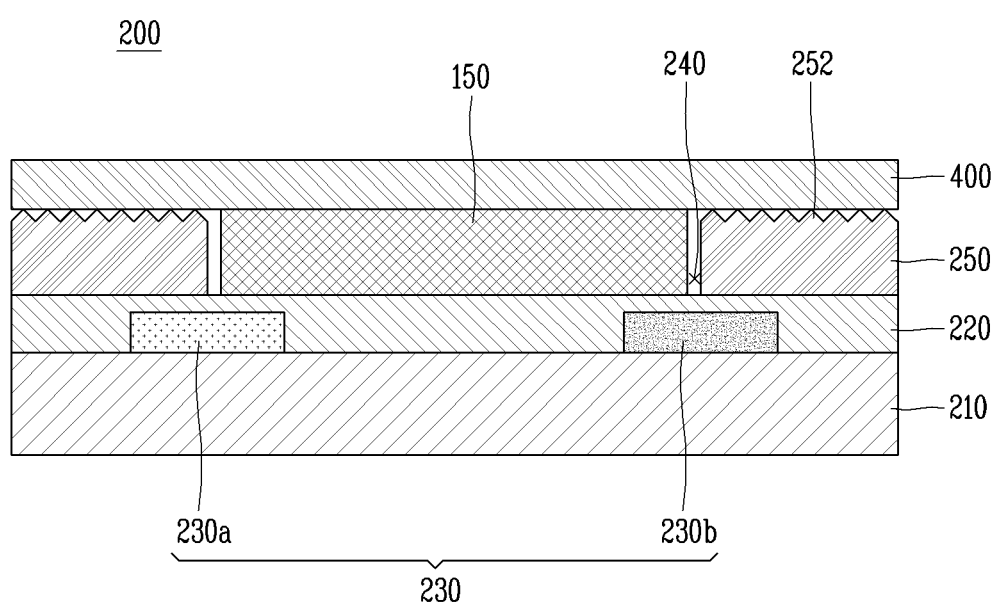
Figure 17C:
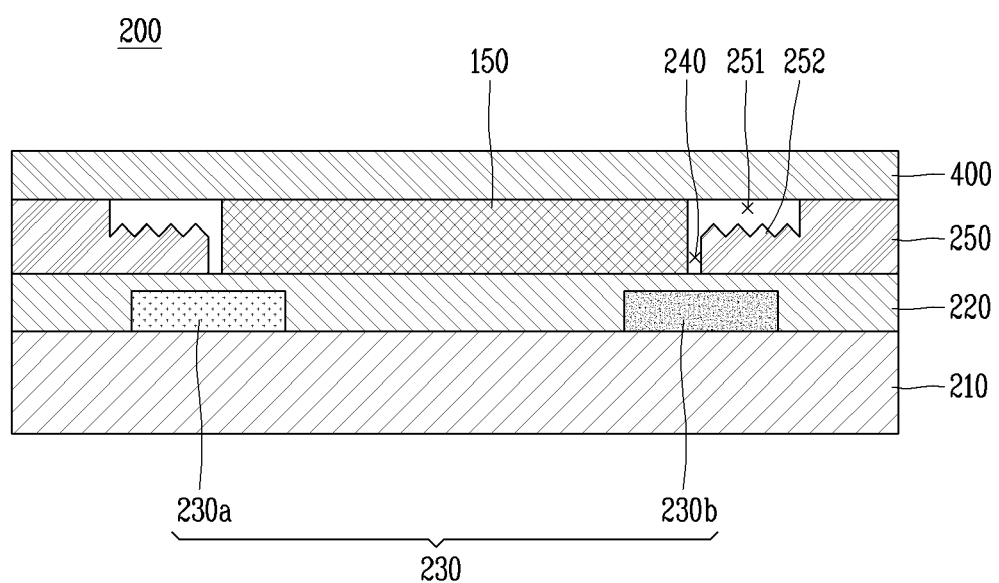
Figure 18:
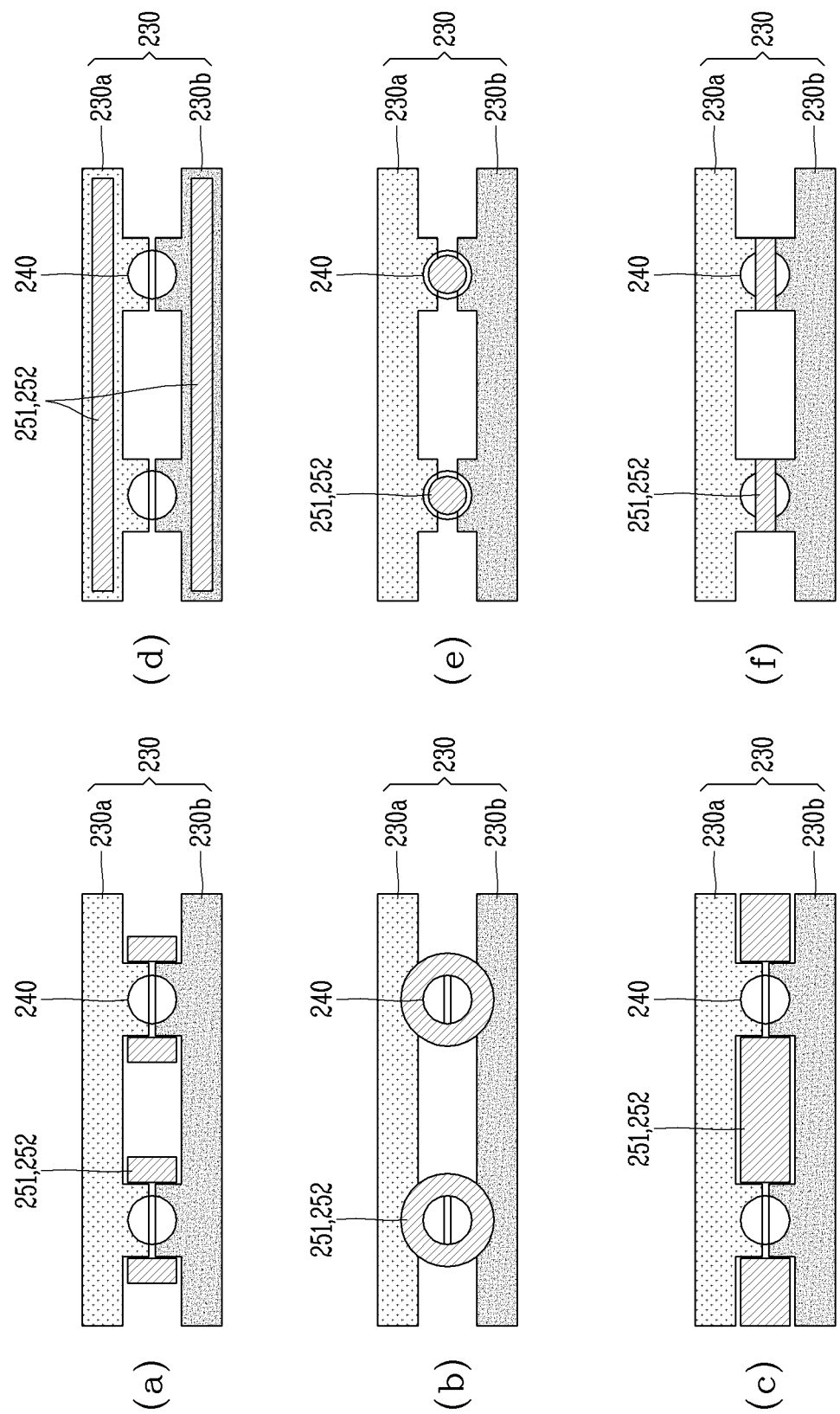
FIG. 18 a top view of an assembly substrate according to an implementation of the present disclosure, exemplarily illustrating various possible positions for forming a recess portion or a concave and convex portion.
Figure 19:
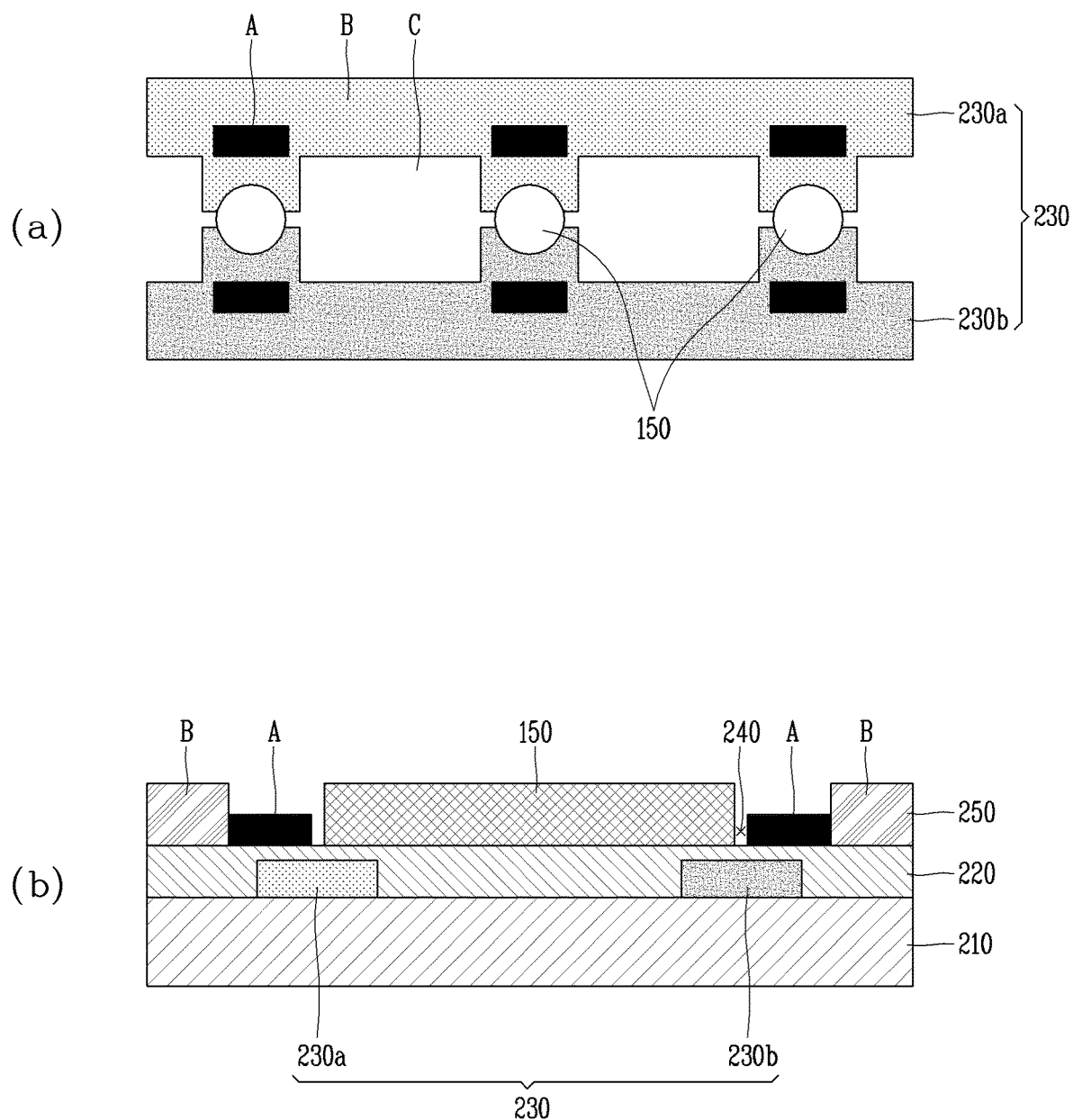
FIG. 19 illustrates examples of regions in an assembly substrate that can be made of materials having different surface energy with respect to a specific material.
Figure 20:
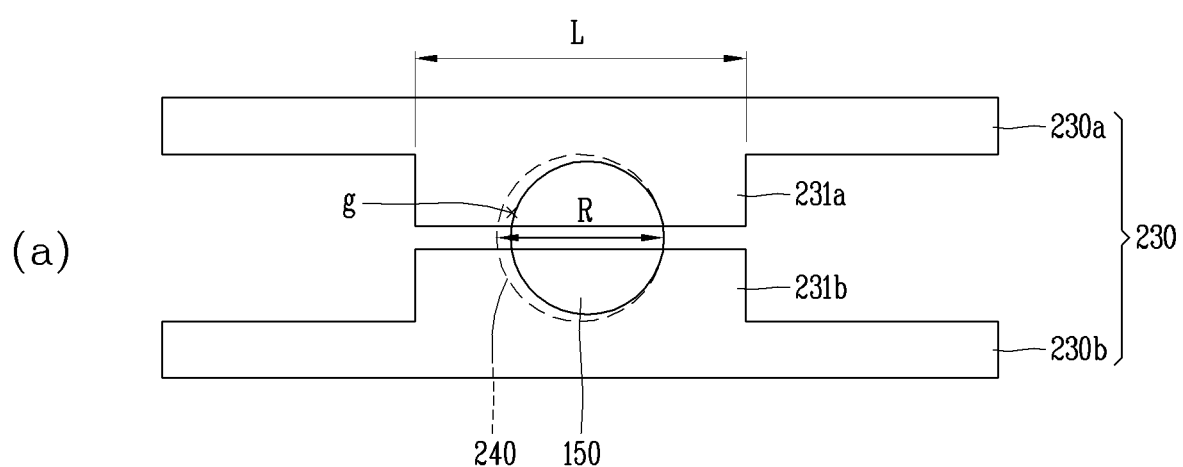
FIG. 20 illustrates various examples of a pair electrode in an assembly substrate according to the present disclosure.
Figure 20:
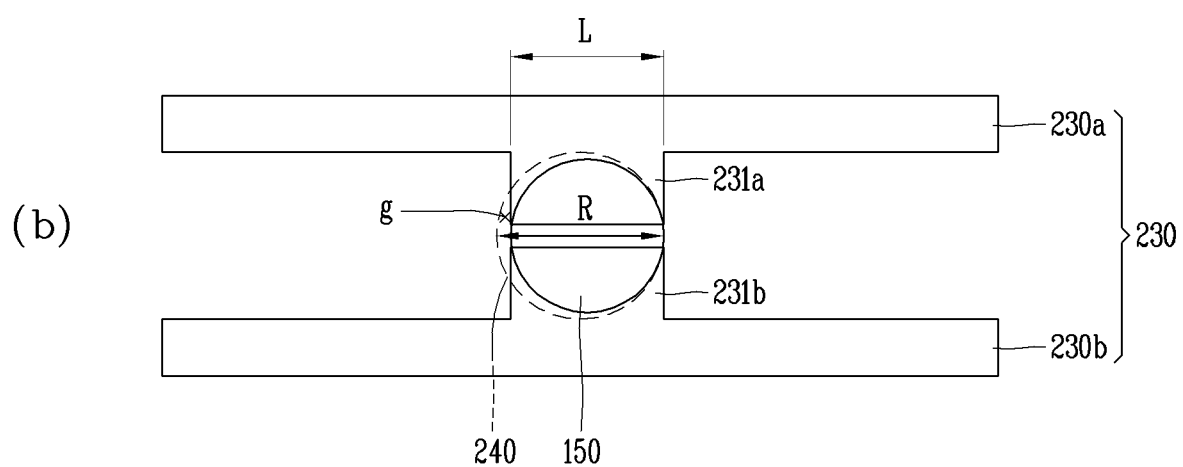

FIGS. 17A to 17C are cross-sectional views illustrating a state (transfer process) in which a transfer substrate is pressed onto an assembly substrate according to one implementation of the present disclosure, FIG. 18 a top view of an assembly substrate according to an implementation of the present disclosure, exemplarily illustrating various possible positions for forming a recess portion or a concave and convex portion, FIG. 19 illustrates examples of regions in an assembly substrate that can be made of materials having different surface energy with respect to a specific material, and FIG. 20 illustrates various examples of a pair electrode in an assembly substrate according to the present disclosure.

Like the conventional assembly substrate 161, an assembly substrate 200 according to this implementation may include a base part 210, a dielectric layer 220, a plurality of pair electrodes 230, cells 240 into which semiconductor light-emitting devices 150 are placed, respectively, and partition walls 250. At least one of a recess portion 251 and a concave and convex portion 252 may be formed on an upper surface of each of the partition walls 250 in contact with a transfer substrate 400.

The plurality of pair electrodes 230 may extend in one direction to be disposed in parallel on the base part 210, and the dielectric layer 220 may be stacked on the base part 210 to cover the plurality of pair electrodes 230.

The partition wall 250 may be disposed on the dielectric layer 220. In detail, the partition wall 250 may be disposed on the dielectric layer 220 to define the cells 240 at predetermined intervals along the extension direction of the plurality of pair electrodes 230 to overlap portions of the plurality of pair electrodes 230. The semiconductor light-emitting devices 150 may be placed into the cells 240, respectively. For example, the partition wall 250 may be made of an organic material such as a polymer, but the present disclosure is not limited thereto.

The pair electrode 230 may produce an electric field in the cell 240 when a voltage is applied, and the semiconductor light-emitting device 150 may be placed into the cell 240 by the electric field formed in the cell 240. The stronger the electric field in the cell 240, the easier for the semiconductor light-emitting device 150 to be placed into the cell 240.

The pair electrode 230 according to an implementation of the present disclosure may include protruding portions 231 protruding from surfaces facing each other to increase strength of a magnetic field formed in the cell 240, and formed at predetermined intervals along an extension direction of the plurality of pair electrodes 230. The protruding portions 231 may be, preferably, formed at the same intervals as the cells 240, so as to allow the cells 240 and the protruding portions 231 to overlap each other.

The protruding portions 231 may alternately protrude from electrodes 230a and 230b of the pair electrode 230, or be formed to face each other as illustrated in FIG. 20.

That is, the pair electrode 230 may include the protruding portions 231 protruding from surfaces of the electrodes 230a and 230b of the pair electrode 230 that face each other, and a protruding portion 231a of the electrode 230a and a protruding portion 231b of the electrode 230b may be formed to face each other to overlap the cell 240.

In addition, both of the protruding portions 231a and 231b facing each other may overlap one cell 240. Here, a stronger electric field E1 may be produced in the cell 240 by the protruding portions 231, allowing an assembly rate of the semiconductor light-emitting devices 150 to be increased.

Meanwhile, the cell 240 may be larger in size than the semiconductor light-emitting device 150 to allow the semiconductor light-emitting device 150 to be easily seated, and tolerance g of several μm or less may be formed in a state that the semiconductor light-emitting device 150 is placed into the cell 240. Here, an electric field formed in the cell 240 may leak through the tolerance g, and the semiconductor light-emitting device 150 may be vertically assembled to a region of the tolerance g (see (a) of FIG. 20).

According to an implementation of the present disclosure, based on the extension direction of the pair electrode 230, a length L of each of the protruding portions 231 may be less (shorter) than a length R of the cell 240 (FIG. (b) of 20), thereby preventing the electric field from leaking through the tolerance g, or minimizing the influence of electric field leakage compared to the related art. Thus, a misassembly rate of the semiconductor light-emitting devices 150 can be reduced.

In order for the semiconductor light-emitting devices 150 to be efficiently transferred onto a transfer assembly 400, the assembly substrate 200 according to an implementation of the present disclosure may include at least one of the recess portion 251 and the concave and convex portion 252 formed on an upper surface of the assembly substrate 200 on which the transfer substrate 400 is pressed. In detail, the recess portion 251 and/or the concave and convex portion 252 may be formed on the upper surface of the partition wall 250.

As the recess portion 251 and the concave and convex portion 252 reduce a contact area between the assembly substrate 200 and the transfer substrate 400, energy acting between a surface of the assembly substrate 200 and a surface of the transfer substrate 400 may be reduced. As a result, a contact force of the transfer substrate 400 can be concentrated on the semiconductor light-emitting devices 150 to thereby improve the transfer rate of the semiconductor light-emitting devices 150.

The recess portion 251 and the concave and convex portion 252 may be formed along a peripheral portion of the semiconductor light-emitting device 150, for example, at least a portion of a periphery of the cell 240.

The recess portion 251 may be formed along at least a portion of the periphery of the cell 240 such that a side surface of the semiconductor light-emitting device 150 is exposed or revealed, and a step may be formed between the semiconductor light-emitting device 150 and the upper surface of the partition wall 250. When the transfer substrate 400 is pressed, the semiconductor light-emitting device 150 and the recess portion 251 may have different contact forces with respect to the transfer substrate 400 due to the step.

The concave and convex portion 252 may be formed on the upper surface of the partition wall 250 along at least a portion of the periphery of the cell 240, and have various shapes and pitches. The concave and convex portion 252 formed on the upper surface of the partition wall 250 may reduce an area of the assembly substrate 200 in contact with the transfer substrate 400 and change a contact angle with the transfer substrate 400. Accordingly, when the transfer substrate 400 is pressed, the semiconductor light-emitting device 150 and the concave and convex portion 252 can have different contact forces with respect to the transfer substrate 400.

As the recess portion 251 or the concave and convex portion 252 is defined in the periphery of the cell 240 into which the semiconductor light-emitting device 150 is seated, different contact forces are generated between the semiconductor light-emitting device and the transfer substrate 400, and between the periphery of the cell 240 and the transfer substrate 400, due to a difference in contact area and the like, allowing the contact force of the transfer substrate 400 to be selectively applied to the semiconductor light-emitting devices 150 to thereby improve the transfer rate of the semiconductor light-emitting devices 150.

Meanwhile, the upper surface of the partition wall 250 may include both the recess portion 251 and the concave and convex portion 252, and the recess portion 251 and the concave and convex portion 252 may be located at different positions, such as positions adjacent to each other and positions spaced apart from each other, or at the same position in an overlapping manner. In the latter case, the concave and convex portion 252 may be formed on the recess portion 252, and the recess portion 251 provided with the concave and convex portion 252 may be formed in a peripheral portion of the semiconductor light-emitting device 150, namely, at least a portion of the periphery of the cell 240. Accordingly, when the transfer substrate 400 is pressed, a difference in contact force between the semiconductor light-emitting device 150 and the peripheral portion of the semiconductor light-emitting device 150 with respect to the transfer substrate 400 may increase.

As illustrated in (a) to (f) of FIG. 18, the recess portion 251 and/or the concave and convex portion 252 may be formed in various shapes and regions other than the periphery of the cell 240 adjacent to the semiconductor light-emitting device 150. In addition, the recess portion 251 and/or the concave and convex portion 252 may be formed in both the periphery of the cell 240 and another region to minimize an area in contact with the transfer substrate 400, allowing a contract force acting between the area of the assembly substrate 200 excluding the semiconductor light-emitting devices 150 and the transfer substrate 400 to be adjusted.

In another implementation, when the transfer substrate 400 is pressed onto the assembly substrate 200 having the aforementioned structure, the region on the assembly substrate 200 in contact with the transfer substrate 400 may be formed of different materials, so that energy acting between a surface of the substrate 200 and a surface of the transfer substrate 400 can be controlled or adjusted.

The transfer substrate 400 may come in contact with the semiconductor light-emitting devices 150 from the upper surface of the assembly substrate 200 on which the semiconductor light-emitting devices 150 are seated. When pressed, the transfer substrate 400 may be brought into contact with the upper surface of the assembly substrate 200 and portions of inner surfaces of the cells 240 into which the semiconductor light-emitting devices 150 are placed, respectively.

Here, in order to improve the transfer rate of the semiconductor light-emitting devices 150 to the transfer substrate 400, different materials may be used for the assembly substrate 200 according to regions on the assembly substrate 200.

First, for the transfer of the semiconductor light-emitting devices 150, the surface of the transfer substrate 400 may be made of a material having a greater contact force with the semiconductor light-emitting devices 150 than a contact force acting between the semiconductor light-emitting devices 150 and the dielectric layer 200 of the assembly substrate 200, and having an adhesive force that causes the semiconductor light-emitting devices 150 to be adhered or attached to the transfer substrate 400 until the semiconductor light-emitting devices 150 are transferred to the final substrate.

For example, the surface of the transfer substrate 400 may be made of polydimethylsiloxane (PDMS) or other materials having similar properties.

When the surface of the transfer substrate 400 is made of the PDMS, the regions on the assembly substrate 200 brought into contact with the transfer substrate 400 upon pressing the transfer substrate 400 may be formed of two or more different materials having different surface energies with respect to the PDMS.

For example, regions A to C of the assembly substrate 200 depicted in FIG. 19 may be regions formed of materials having different surface energies with respect to the PDMS, and at least two regions may be made of materials having different surface energies from the PDMS.

A material having the highest surface energy with respect to the PDMS among the materials forming the assembly substrate 200 may define at least a portion of an inner periphery of the cell 240, and a material having the lowest surface energy with respect to the PDMS may define at least a portion of the upper surface of the partition wall 250.

Referring to (a) and (b) of FIG. 19, at least the region A corresponding to a peripheral region of the semiconductor light-emitting device 150 of the displayed regions may be made of a material having a higher surface energy than other regions (regions B and C) with respect to the PDMS. The region A may be a region formed along the inner periphery of the cell 240, and the regions B and C may be specific regions of the upper surface of the partition wall in which the recess portion 251 and/or the concave and convex portion 252 are formed.

Meanwhile, in association with the material forming the assembly substrate 200, the region A formed along the inner periphery of the cell 240 may be made of an inorganic material, such as $SiO_x$ and $SiN_x$, or a conductive metal. The regions B and C corresponding to the upper surface of the partition wall 250 may each be made of a material having a relatively low contact force with respect to the PDMS, such as an organic material and ITO.

Hereinafter, a display manufacturing method using the assembly substrate 200 according to the present disclosure will be briefly described.

According to the present disclosure, a display device including the assembly substrate 200 with the aforementioned structure may be manufactured by the conventional method for manufacturing a display device using the self-assembly.

In detail, a method for manufacturing a display device according to the present disclosure may include the steps of moving the assembly substrate 200 having the above-described structure to an assembly position, putting a plurality of semiconductor light-emitting devices 150 including magnetic materials into a fluid chamber, applying a magnetic force to the semiconductor light-emitting devices 150 put into the fluid chamber to cause the semiconductor light-emitting devices 150 to move along one direction, applying an electric field to guide the semiconductor light-emitting devices 150 to predetermined positions while moving such that the semiconductor light emitting-devices 150 can be placed at the predetermined positions of the assembly substrate 200, transferring the semiconductor light emitting-devices 150 placed at the predetermined positions of the assembly substrate 200 to a transfer substrate 400, and transferring the semiconductor light-emitting devices 150 to a final substrate in which wiring is formed.

During the transfer process, a transfer substrate 400 having protrusion portions formed on one surface thereof in contact with the assembly substrate 200 may be used. Here, the transfer of the semiconductor light-emitting devices 150 to the transfer substrate 400 may be carried out by aligning the protrusion portions formed on the transfer substrate 400 and the semiconductor light-emitting devices 150 seated on the assembly substrate 200 to overlap each other, and then pressing the transfer substrate 400 onto the assembly substrate 200. A shape of the protrusion portion formed on the transfer substrate 400 is not particularly limited as long as it protrudes toward the assembly substrate 200.

The assembly substrate 200 used for the manufacturing method may include at least one of a recess portion 251 and a concave and convex portion 252 formed on an upper surface of the partition wall 250 so as to reduce energy acting between a surface of the assembly substrate 200 and a surface of the transfer substrate 400, allowing a contact force of the transfer substrate 400 to be relatively concentrated on the semiconductor light-emitting devices 150. As a result, the transfer rate of the semiconductor light-emitting devices 150 can be increased.

In addition, in the assembly substrate 200 used for the manufacturing method, the influence of a magnetic force formed in the cell 240 can be increased by protruding portions 231 of a pair electrode 230, allowing the semiconductor light-emitting devices 150 to be easily placed into the cells 240, respectively. Further, leakage of an electric field E1 through tolerance g can be prevented to thereby reduce the misassembly rate.

The present discourse is not limited to the configuration and the method of the implementations described above, but the implementations may be configured such that all or some of the implementations are selectively combined so that various modifications can be made.

The invention claimed is:

1. An assembly substrate used in a display manufacturing method for placing semiconductor light-emitting devices to predetermined positions thereof using an electric field and a magnetic field, the assembly substrate comprising:
    a base part;
    a plurality of pair electrodes extending in one direction and disposed in parallel on the base part;
    a dielectric layer disposed on the base part to cover the plurality of pair electrodes; and
    partition walls disposed on the dielectric layer and defining cells at predetermined intervals along the one direction of the plurality of pair electrodes so as to overlap portions of the plurality of pair electrodes, and the semiconductor light-emitting devices being placed into the cells, respectively,
    wherein at least one of a recess portion and a concave and convex portion formed on an upper surface of each of the partition walls reduces energy acting between the assembly substrate and a transfer substrate.

2. The assembly substrate of claim 1, wherein the plurality of pair electrodes each include protruding portions protruding from surfaces facing each other and disposed at predetermined intervals along the one direction of the plurality of pair electrodes, and
    wherein each of the cells overlaps the protruding portions.

3. The assembly substrate of claim 2, wherein the protruding portions protruding from the surfaces of the plurality of pair electrodes face each other.

4. The assembly substrate of claim 2, wherein the protruding portions each have a length shorter than a length of a cell among the cells based on the one direction of the plurality of pair electrodes.

5. The assembly substrate of claim 1, wherein the recess portion is formed along at least a portion of a periphery of a cell among the cells to allow a side surface of a semiconductor light-emitting device placed into the cell to be exposed.

6. The assembly substrate of claim 1, wherein the concave and convex portion is formed along at least a portion of a periphery of a cell among the cells.

7. The assembly substrate of claim 1, wherein the concave and convex portion is formed on the recess portion when a partition wall among the partition walls includes both the recess portion and the concave and convex portion.

8. The assembly substrate of claim 7, wherein the recess portion is formed along at least a portion of a periphery of a cell among the cells.

9. The assembly substrate of claim 1, wherein the assembly substrate is made of two or more different materials having different surface energy with respect to a specific material.

10. The assembly substrate of claim 9, wherein a material having a higher surface energy with respect to the specific material defines at least a portion of an inner periphery of a cell among the cells.

11. The assembly substrate of claim 9, wherein a material having a lower surface energy with respect to the specific material defines at least a portion of the upper surface of a partition wall among the partition walls.

12. The assembly substrate of claim 9, wherein the specific material is polydimethylsiloxane (PDMS).

13. A method for manufacturing a display device using the assembly substrate of claim 1, the method comprising:
    moving the assembly substrate to an assembly position and putting the semiconductor light-emitting devices including magnetic materials into a fluid chamber;
    applying a magnetic force to the semiconductor light-emitting devices put into the fluid chamber to cause the semiconductor light-emitting devices to move in the one direction;
    applying an electric field to guide the semiconductor light-emitting devices to the predetermined positions while moving in the one direction such that the semiconductor light-emitting devices are placed at the predetermined positions of the assembly substrate respectively;
    transferring the semiconductor light-emitting devices placed at the predetermined positions to the transfer substrate; and
    transferring the semiconductor light-emitting devices on the transfer substrate to a final substrate having a wiring.

14. The method of claim 13, wherein a surface of the transfer substrate is made of polydimethylsiloxane (PDMS).

15. The method of claim 13, wherein the at least one of the recess portion and the concave and convex portion communicates with the transfer substrate when transferring the semiconductor light-emitting devices placed at the predetermined positions to the transfer substrate.

16. The method of claim 15, wherein a concave of the concave and convex portion contacts the transfer substrate when transferring the semiconductor light-emitting devices placed at the predetermined positions to the transfer substrate.

17. The assembly substrate of claim 1, wherein the at least one of the recess portion and the concave and convex portion overlaps with the plurality of pair electrodes.

18. An assembly substrate to seat semiconductor light emitting diodes at preset positions on the assembly substrate, the assembly substrate comprising:
    a plurality of pair electrodes extending in one direction at predetermined intervals;
    a dielectric layer to cover the plurality of pair electrodes;
    partition walls on the dielectric layer and defining cells at the preset positions; and
    at least one of a recess portion and a concave and convex portion formed on an upper surface of each of the partition walls reduces energy acting between the assembly substrate and a transfer substrate.

19. The assembly substrate of claim 18, wherein the at least one of a recess portion and the concave and convex portion are formed at a location of the partition walls that overlaps with the plurality of pair electrodes.

20. The assembly substrate of claim 18, wherein a height of the at least one of a recess portion and a concave and convex portion is the same or lower than a height of the partition walls.

* * * * *